(12) United States Patent
Yusuf

(10) Patent No.: US 10,361,676 B2
(45) Date of Patent: Jul. 23, 2019

(54) BAW FILTER STRUCTURE WITH INTERNAL ELECTROSTATIC SHIELDING

(71) Applicant: Qorvo US, Inc., Greensboro, NC (US)

(72) Inventor: Yazid Yusuf, Orlando, FL (US)

(73) Assignee: Qorvo US, Inc., Greensboro, NC (US)

( * ) Notice: Subject to any disclaimer, the term of this patent is extended or adjusted under 35 U.S.C. 154(b) by 60 days.

(21) Appl. No.: 15/720,706

(22) Filed: Sep. 29, 2017

(65) Prior Publication Data
US 2019/0103851 A1    Apr. 4, 2019

(51) Int. Cl.
*H03H 9/02*    (2006.01)
*H03H 9/54*    (2006.01)

(52) U.S. Cl.
CPC ............ *H03H 9/54* (2013.01); *H03H 9/0211* (2013.01); *H03H 9/02125* (2013.01); *H03H 9/02141* (2013.01)

(58) Field of Classification Search
CPC ........................ H03H 9/54–62; H03H 9/02125
See application file for complete search history.

(56) References Cited

U.S. PATENT DOCUMENTS

| | | |
|---|---|---|
| 3,731,230 A | 5/1973 | Cerny, Jr. |
| 3,875,533 A | 4/1975 | Irwin et al. |
| 4,577,168 A | 3/1986 | Hartmann |
| 5,291,159 A | 3/1994 | Vale |
| 6,067,391 A | 5/2000 | Land |
| 6,714,099 B2 | 3/2004 | Hikita et al. |
| 6,720,844 B1 | 4/2004 | Lakin |
| 6,927,649 B2 * | 8/2005 | Metzger .............. H03H 9/0557 333/133 |
| 7,057,478 B2 | 6/2006 | Korden et al. |
| 7,173,504 B2 | 2/2007 | Larson, III et al. |
| 7,239,067 B2 | 7/2007 | Komuro et al. |

(Continued)

FOREIGN PATENT DOCUMENTS

JP    2012257050 A    12/2012

OTHER PUBLICATIONS

Final Office Action for U.S. Appl. No. 14/757,651, dated Sep. 19, 2018, 7 pages.

(Continued)

*Primary Examiner* — Dean O Takaoka
*Assistant Examiner* — Alan Wong
(74) *Attorney, Agent, or Firm* — Withrow & Terranova, P.L.L.C.

(57) ABSTRACT

Embodiments of the disclosure are directed to a Bulk Acoustic Wave (BAW) filter structure with internal electrostatic shielding. In exemplary aspects disclosed herein, a shielded BAW filter structure includes a substrate, a plurality of transducers over the substrate, and a planar electrostatic shield between the substrate and a top electrode of the plurality of transducers. Each of the plurality of transducers forms a portion of a BAW resonator and resides in a filter including a parasitic capacitance. The planar electrostatic shield is coupled to a ground node and interrupts an electrical field associated with the parasitic capacitance of the filter to reduce the parasitic capacitance. Accordingly, the shielded BAW filter structure reduces the influence of parasitic capacitance providing improved filtering performance compared to an unshielded BAW filter structure.

20 Claims, 26 Drawing Sheets

(56) References Cited

U.S. PATENT DOCUMENTS

| | | | |
|---|---|---|---|
| 7,321,183 B2* | 1/2008 | Ebuchi | H03H 3/02 310/324 |
| 7,342,351 B2* | 3/2008 | Kubo | H03H 3/02 310/340 |
| 7,391,285 B2 | 6/2008 | Larson, III et al. | |
| 7,436,269 B2 | 10/2008 | Wang et al. | |
| 7,804,374 B1 | 9/2010 | Brown et al. | |
| 7,825,749 B2 | 11/2010 | Thalhammer et al. | |
| 7,898,493 B1 | 3/2011 | Rojas et al. | |
| 7,956,705 B2 | 6/2011 | Meister et al. | |
| 7,973,620 B2 | 7/2011 | Shirakawa et al. | |
| 8,248,185 B2* | 8/2012 | Choy | H03H 9/02118 310/322 |
| 8,508,315 B2 | 8/2013 | Jamneala et al. | |
| 8,576,024 B2 | 11/2013 | Erb et al. | |
| 8,923,794 B2 | 12/2014 | Aigner | |
| 8,991,022 B2 | 3/2015 | Satoh et al. | |
| 9,054,671 B2 | 6/2015 | Adkisson et al. | |
| 9,054,674 B2* | 6/2015 | Inoue | H03H 9/02913 |
| 9,484,883 B2* | 11/2016 | Nishizawa | H03H 9/54 |
| 9,698,756 B2 | 7/2017 | Khlat et al. | |
| 9,887,686 B2* | 2/2018 | Kuwahara | H03H 9/725 |
| 9,929,716 B2 | 3/2018 | Lee et al. | |
| 10,009,001 B2 | 6/2018 | Jiang et al. | |
| 2002/0109564 A1* | 8/2002 | Tsai | H03H 9/105 333/187 |
| 2005/0093648 A1 | 5/2005 | Inoue | |
| 2005/0206476 A1 | 9/2005 | Ella et al. | |
| 2006/0091978 A1 | 5/2006 | Wang et al. | |
| 2008/0007369 A1 | 1/2008 | Barber et al. | |
| 2009/0096549 A1 | 4/2009 | Thalhammer et al. | |
| 2009/0096550 A1 | 4/2009 | Handtmann et al. | |
| 2010/0277237 A1 | 11/2010 | Sinha et al. | |
| 2011/0210787 A1 | 9/2011 | Lee et al. | |
| 2012/0007696 A1 | 1/2012 | Pang et al. | |
| 2012/0313725 A1 | 12/2012 | Ueda et al. | |
| 2013/0113576 A1 | 5/2013 | Inoue et al. | |
| 2015/0222246 A1 | 8/2015 | Nosaka | |
| 2015/0369153 A1 | 12/2015 | Tsunooka et al. | |
| 2016/0028364 A1 | 1/2016 | Takeuchi | |
| 2016/0191012 A1 | 6/2016 | Khlat et al. | |
| 2016/0191014 A1 | 6/2016 | Khlat et al. | |
| 2016/0191016 A1 | 6/2016 | Khlat et al. | |
| 2016/0261235 A1 | 9/2016 | Ortiz | |
| 2016/0268998 A1 | 9/2016 | Xu et al. | |
| 2017/0093369 A1 | 3/2017 | Khlat et al. | |
| 2017/0093370 A1 | 3/2017 | Khlat et al. | |
| 2017/0201233 A1 | 7/2017 | Khlat | |
| 2017/0301992 A1 | 10/2017 | Khlat et al. | |
| 2017/0324159 A1 | 11/2017 | Khlat | |
| 2018/0013402 A1 | 1/2018 | Kirkpatrick et al. | |
| 2018/0076793 A1 | 3/2018 | Khlat et al. | |
| 2018/0076794 A1 | 3/2018 | Khlat et al. | |
| 2018/0109237 A1 | 4/2018 | Wasilik et al. | |
| 2018/0219530 A1 | 8/2018 | Khlat et al. | |
| 2018/0358947 A1 | 12/2018 | Mateu et al. | |

OTHER PUBLICATIONS

Non-Final Office Action for U.S. Appl. No. 15/701,759, dated Oct. 4, 2018, 10 pages.

Non-Final Office Action for U.S. Appl. No. 14/757,587, dated Sep. 13, 2016, 12 pages.

Notice of Allowance for U.S. Appl. No. 14/757,587, dated Mar. 9, 2017, 8 pages.

Non-Final Office Action for U.S. Appl. No. 15/004,084, dated Jun. 12, 2017, 9 pages.

Non-Final Office Action for U.S. Appl. No. 14/757,651, dated Jun. 9, 2017, 11 pages.

Non-Final Office Action for U.S. Appl. No. 15/275,957, dated Jun. 14, 2017, 9 pages.

Ex Parte Quayle Action for U.S. Appl. No. 15/347,452, mailed Jun. 15, 2017, 7 pages.

Author Unknown, "SAW Filters—SAW Resonators: Surface Acoustic Wave SAW Components," Product Specification, 2010, Token Electronics Industry Co., Ltd., 37 pages.

Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.

Kwa, Tom, "Wafer-Level Packaged Accelerometer With Solderable SMT Terminals," IEEE Sensors, Oct. 22-25, 2006, Daegu, South Korea, IEEE, pp. 1361-1364.

Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.

Schneider, Robert, "High-Q AIN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.

Lakin, K M., "Coupled Resonator Filters," 2002 IEEE Ultrasonics Symposium, Oct. 8-11, 2002, Munich, Germany, 8 pages.

López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.

Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.

Final Office Action for U.S. Appl. No. 15/275,957, dated Jan. 2, 2018, 7 pages.

Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.

De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.

Lakin, K. M., "Bulk Acoustic Wave Coupled Resonator Filters," International Frequency Control Symposium, 2002, IEEE, pp. 8-14.

Shirakawa, A. A., et al., "Bulk Acoustic Wave Coupled Resonator Filters Synthesis Methodology," European Microwave Conference, Oct. 4-6, 2005, Paris, France, IEEE, 4 pages.

Tosic, Dejan, et al., "Symbolic analysis of immitance inverters," 14th Telecommunications Forum, Nov. 21-23, 2006, Belgrade, Serbia, pp. 584-487.

Non-Final Office Action for U.S. Appl. No. 14/757,651, dated May 8, 2018, 8 pages.

Notice of Allowance for U.S. Appl. No. 15/347,428, dated Jul. 12, 2018, 9 pages.

Notice of Allowance for U.S. Appl. No. 15/490,381, dated May 23, 2018, 8 pages.

Notice of Allowance for U.S. Appl. No. 15/727,117, dated Mar. 13, 2019, 9 pages.

Non-Final Office Action for U.S. Appl. No. 15/586,374, dated Feb. 26, 2019, 16 pages.

Non-Final Office Action for U.S. Appl. No. 15/697,658, dated May 1, 2019, 13 pages.

* cited by examiner

BAW FILTER STRUCTURE WITH INTERNAL ELECTROSTATIC SHIELDING

FIELD OF THE DISCLOSURE

The present invention relates to a Bulk Acoustic Wave (BAW) filter structure with internal electrostatic shielding for improved filtering, particularly improved filter rejection.

BACKGROUND

Acoustic resonators, and particularly Bulk Acoustic Wave (BAW) resonators, are used in many high frequency communication applications. In particular, BAW resonators are often employed in filter networks that operate at frequencies above 1.5 GHz and require a flat passband, have exceptionally steep filter skirts and squared shoulders at the upper and lower ends of the passband, and provide excellent rejection outside of the passband. BAW-based filters also have relatively low insertion loss, tend to decrease in size as the frequency of operation increases, and are relatively stable over wide temperature ranges. As such, BAW-based filters are the filter of choice for many 3rd Generation (3G) and 4th Generation (4G) wireless devices, and are destined to dominate filter applications for 5th Generation (5G) wireless devices. Most of these wireless devices support cellular, wireless fidelity (Wi-Fi), Bluetooth, and/or near field communications on the same wireless device, and as such, pose extremely challenging filtering demands. While these demands keep raising the complexity of the wireless devices, there is a constant need to improve the performance of BAW resonators and BAW-based filters as well as decrease the cost and size associated therewith.

Electrostatic interference in a BAW filter (e.g., BAW die, BAW filter die, etc.), or other BAW structure, can negatively affect performance. In particular, parasitic capacitance (i.e., capacitive parasitics, parasitic coupling, parasitic capacitance coupling, etc.) in a BAW filter can degrade filter rejection in a stopband. Types of unwanted parasitic capacitance include inter-stage coupling and capacitive feedthrough. Capacitive feedthrough is generally more severe than inter-stage coupling and is defined by a parasitic capacitance coupling directly between the input and output of the filter. Feedthrough capacitances as little as 0.5 F can cause significant filter rejection degradation, thereby negatively affecting filter performance.

SUMMARY

Embodiments of the disclosure are directed to a Bulk Acoustic Wave (BAW) filter structure with internal electrostatic shielding. In exemplary aspects disclosed herein, a shielded BAW filter structure includes a substrate, a plurality of transducers over the substrate, and a planar electrostatic shield between the substrate and a top electrode of the plurality of transducers. Each of the plurality of transducers forms a portion of a BAW resonator and resides in a filter coupled between an input node and an output node. The filter includes a parasitic capacitance, which may affect filtering performance (e.g., filter rejection degradation). The planar electrostatic shield is coupled to a ground node and interrupts an electrical field associated with the parasitic capacitance of the filter to reduce the parasitic capacitance. In other words, the planar electrostatic shield is positioned proximate to or within the electrical field forming the parasitic capacitance to interrupt the electrical field and weaken the strength of the parasitic capacitance. Accordingly, the shielded BAW filter structure reduces the influence of parasitic capacitance providing improved filtering performance compared to an unshielded BAW filter structure.

One embodiment of the disclosure relates to a BAW filter structure with internal shielding. The BAW filter structure comprises a substrate, a plurality of transducers over the substrate, and a planar electrostatic shield. Each of the plurality of transducers comprises a bottom electrode, a piezoelectric layer over the bottom electrode, and a top electrode over the piezoelectric layer. Each of the plurality of transducers forms a portion of a BAW resonator and resides in a filter coupled between an input node and an output node and has parasitic electrical field lines forming a parasitic capacitance. The planar electrostatic shield is positioned between the substrate and at least one of the top electrodes of the plurality of transducers. The planar electrostatic shield is coupled to a ground node and interrupts an electrical field associated with the parasitic capacitance of the filter to reduce the parasitic capacitance.

An additional embodiment of the disclosure relates to a BAW filter assembly comprising a laminate and a BAW filter structure. The laminate comprises a laminate dielectric, a grounding trace at least partially positioned within the laminate dielectric, and a signal trace at least partially positioned within the laminate dielectric. The BAW filter structure comprises a substrate, a plurality of transducers over the substrate, and a planar electrostatic shield. Each of the plurality of transducers comprises a bottom electrode, a piezoelectric layer over the bottom electrode, and a top electrode over the piezoelectric layer. Each of the plurality of transducers forms a portion of a BAW resonator and resides in a filter coupled between an input node and an output node and has a parasitic capacitance. The planar electrostatic shield is positioned between the substrate and at least one of the top electrodes of the plurality of transducers. The planar electrostatic shield is coupled to a ground node and interrupts an electrical field associated with the parasitic capacitance of the filter to reduce the parasitic capacitance. The BAW filter structure is invertedly positioned over a top of the laminate.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
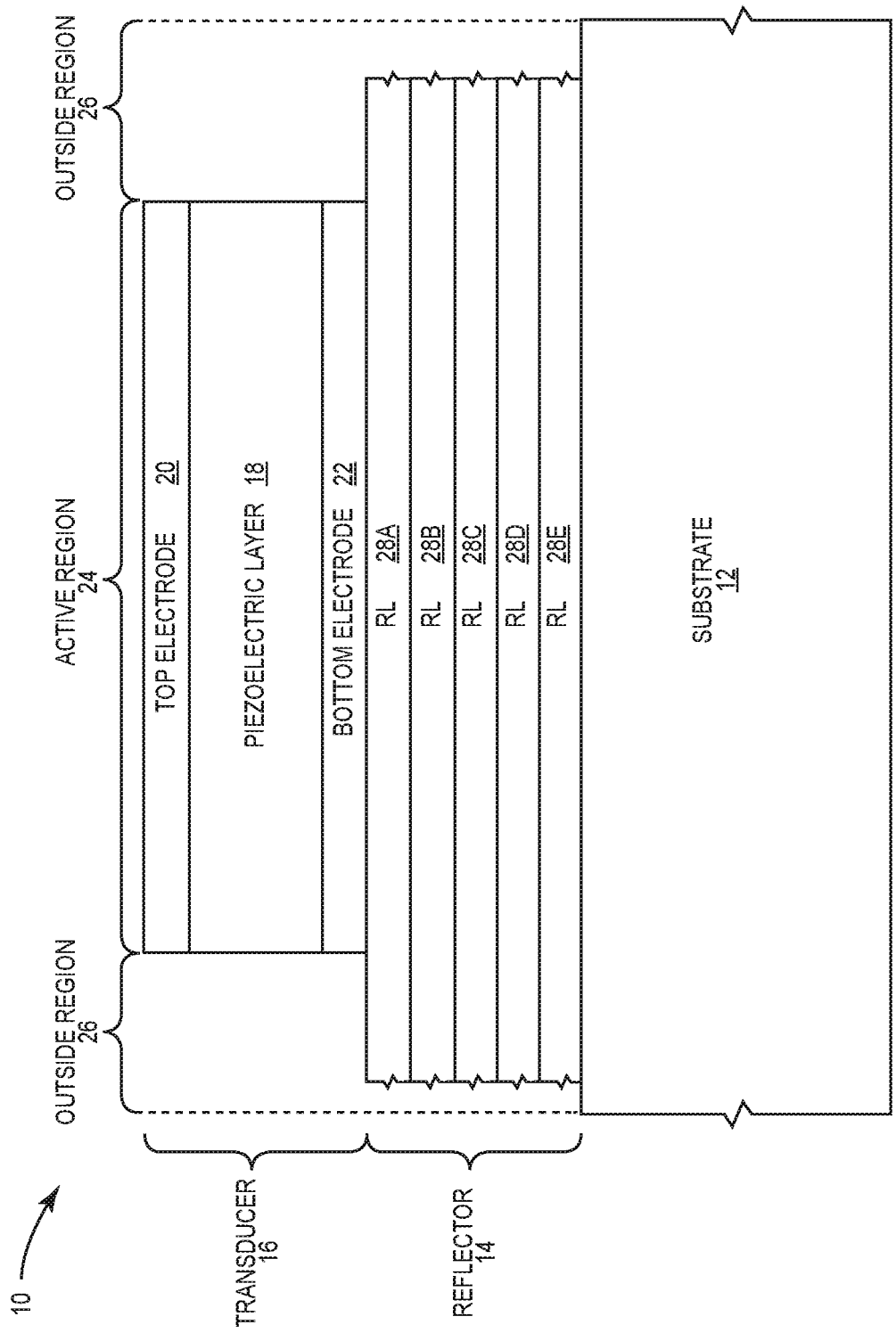
FIG. 1 illustrates a conventional Bulk Acoustic Wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

As disclosed herein, a Bulk Acoustic Wave (BAW) filter structure with internal shielding includes a substrate, a plurality of transducers over the substrate, and a planar electrostatic shield between the substrate and a top electrode of the plurality of transducers. Each of the plurality of transducers forms a portion of a BAW resonator and resides in a first filter coupled between an input node and an output node. The first filter includes a parasitic capacitance, which may affect filtering performance (e.g., filter rejection degradation). The planar electrostatic shield is coupled to a ground node and interrupts an electrical field associated with the parasitic capacitance of the first filter to reduce the parasitic capacitance. In other words, the planar electrostatic shield is positioned proximate to or within the electrical field forming the parasitic capacitance to interrupt the electrical field and weaken the strength of the parasitic capacitance. Accordingly, the shielded BAW filter structure reduces the influence of parasitic capacitance providing improved filtering performance compared to an unshielded BAW filter structure.

Prior to delving into the details of these concepts, an overview of BAW resonators and filters that employ BAW resonators is provided. BAW resonators are used in many high-frequency filter applications. An exemplary BAW resonator 10 is illustrated in FIG. 1. The BAW resonator 10 is a solidly mounted resonator (SMR) type BAW resonator 10 and generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20, 22 may be formed of Tungsten (W), Molybdenum (Mo), Platinum (Pt), or like material, and the piezoelectric layer 18 may be formed of Aluminum Nitride (AlN), Zinc Oxide (ZnO) or other appropriate piezoelectric material. Although shown in FIG. 1 as including a single layer, the piezoelectric layer 18, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20, 22 overlap and also includes the layers below the overlapping top and bottom electrodes 20, 22. The outside region 26 corresponds to the section of the BAW resonator 10 that surrounds the active region 24.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically-propagating acoustic waves in the transducer 16. Acoustic waves traveling upwardly are reflected back into the transducer 16 by the air-metal boundary at the top surface of the top electrode 20. Acoustic waves traveling downwardly are reflected back into the transducer 16 by the reflector 14, or by an air cavity, which is provided just below the transducer in a Film BAW Resonator (FBAR).

The reflector 14 is typically formed by a stack of reflector layers (RL) 28A through 28E (referred to generally as reflector layers 28), which alternate in material composition to produce a significant reflection coefficient at the junction of adjacent reflector layers 28. Typically, the reflector layers 28A through 28E alternate between materials having high and low acoustic impedances, such as tungsten (W) and silicon dioxide (SiO2). While only five reflector layers 28A through 28E are illustrated in FIG. 1, the number of reflector layers 28 and the structure of the reflector 14 will vary from one design to another.

Figure 2:
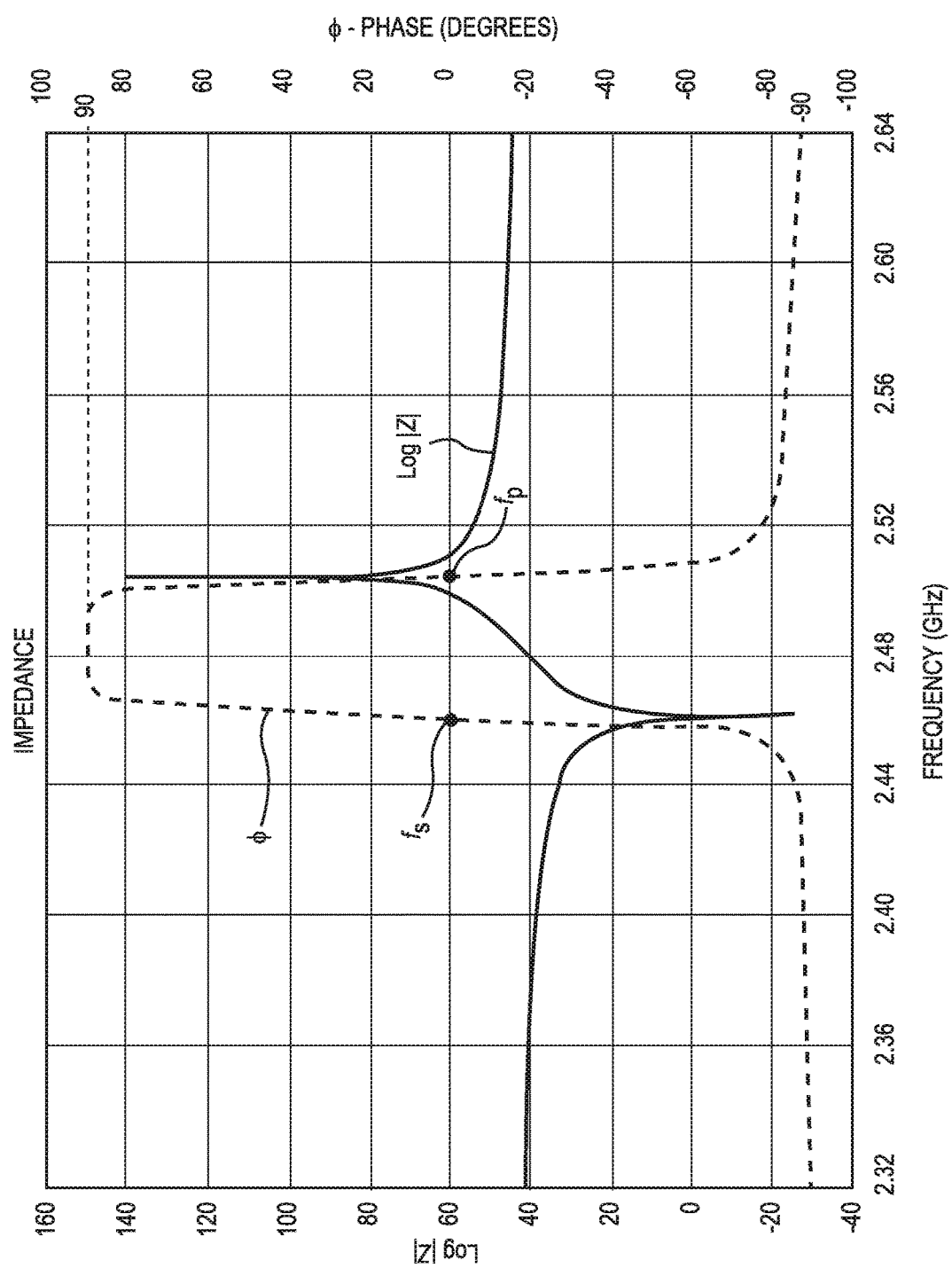
FIG. 2 is a graph of the magnitude and phase of impedance over frequency responses as a function of frequency for an ideal BAW resonator.

The magnitude (Z) and phase (ϕ)) of the electrical impedance as a function of the frequency (GHz) for a relatively ideal BAW resonator 10 is provided in FIG. 2. The magnitude (Z) of the electrical impedance is illustrated by the solid line, while the phase (ϕ)) of the electrical impedance is illustrated by the dashed line. A unique feature of the BAW resonator 10 is that it has both a resonance frequency and an anti-resonance frequency. The resonance frequency is typically referred to as the series resonance frequency (fs), and the anti-resonance frequency is typically referred to as the parallel resonance frequency (fp). The series resonance frequency (fs) occurs when the magnitude of the impedance, or reactance, of the BAW resonator 10 approaches zero. The parallel resonance frequency (fp) occurs when the magnitude of the impedance, or reactance, of the BAW resonator 10 peaks at a significantly high level. In general, the series resonance frequency (fs) is a function of the thickness of the piezoelectric layer 18 and the mass of the bottom and top electrodes 20, 22.

For the phase, the BAW resonator 10 acts like an inductance that provides a 90° phase shift between the series resonance frequency (fs) and the parallel resonance frequency (fp). In contrast, the BAW resonator 10 acts like a capacitance that provides a −90° phase shift below the series resonance frequency (fs) and above the parallel resonance frequency (fp). The BAW resonator 10 presents a very low, near zero, resistance at the series resonance frequency (fs), and a very high resistance at the parallel resonance frequency (fp). The electrical nature of the BAW resonator 10 lends itself to the realization of a very high quality factor (Q) inductance over a relatively short range of frequencies, which has proven to be very beneficial in high frequency filter networks, especially those operating at frequencies around 1.8 GHz and above.

Figure 3:
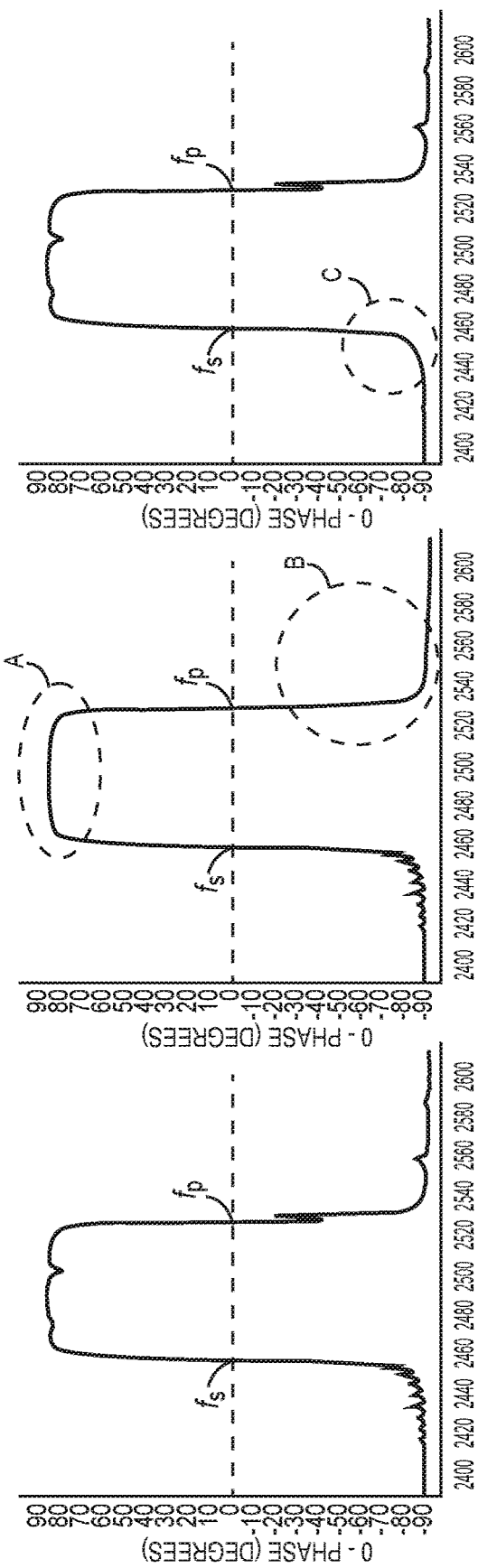
FIGS. 3A-3C are graphs of phase responses for various BAW resonator configurations.

Unfortunately, the phase (ϕ)) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency (fs), between the series resonance frequency (fs) and the parallel resonance frequency (fp), and above the parallel resonance frequency (fp). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential quality factor (Q) associated with the BAW resonator 10.

Figure 4:
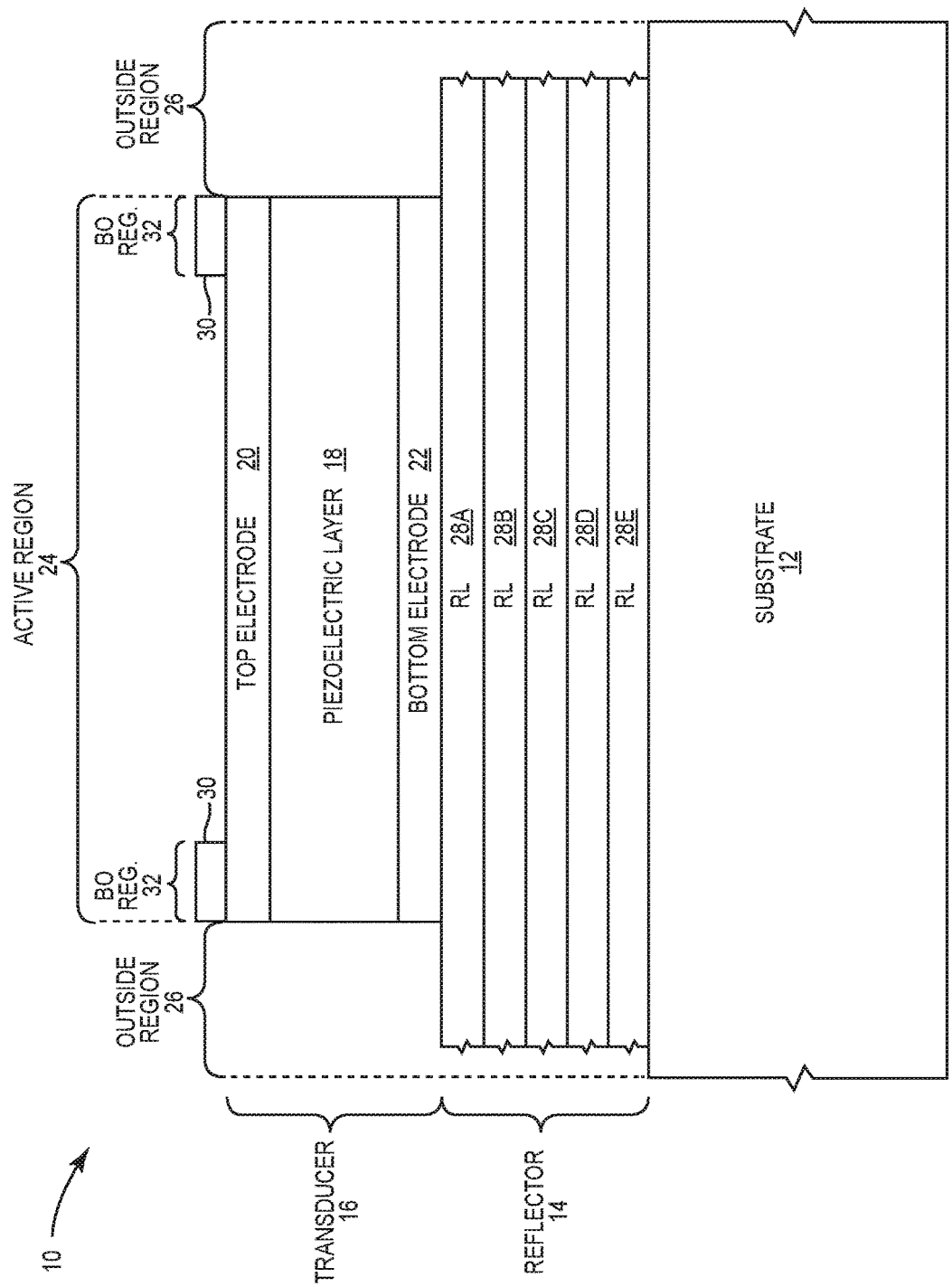
FIG. 4 illustrates a conventional BAW resonator with a border ring.

As illustrated in FIG. 4, a border (BO) ring 30 is formed on or within the top electrode 20 to suppress certain of the spurious modes. The spurious modes that are suppressed by the BO ring 30 are those above the series resonance frequency (fs), as highlighted by circles A and B in the phase curve of FIG. 3B. Circle A shows a suppression of the ripple, and thus the spurious mode, in the passband of the phase curve, which resides between the series resonance frequency (fs) and the parallel resonance frequency (fp). Circle B shows suppression of the ripple, and thus the spurious modes, above the parallel resonance frequency (fp). Notably, the spurious mode in the upper shoulder of the passband, which is just below the parallel resonance frequency (fp), and the spurious modes above the passband are suppressed, as evidenced by the smooth or substantially ripple free phase curve between the series resonance frequency (fs) and the parallel resonance frequency (fp) and above the parallel resonance frequency (fp).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside of the active region 24.

While the BO ring 30 is effective at suppressing spurious modes above the series resonance frequency (fs), the BO ring 30 has little or no impact on those spurious modes below the series resonance frequency (fs), as shown in FIG. 3B. A technique referred to as apodization is often used to suppress the spurious modes that fall below the series resonance frequency (fs).

Apodization works to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency (fs) are suppressed. Assuming no BO ring 30 is provided, one can readily see in FIG. 3C that apodization fails to suppress those spurious modes above the series resonant frequency (fs). As such, the typical BAW resonator 10 employs both apodization and the BO ring 30.

Figure 5A:
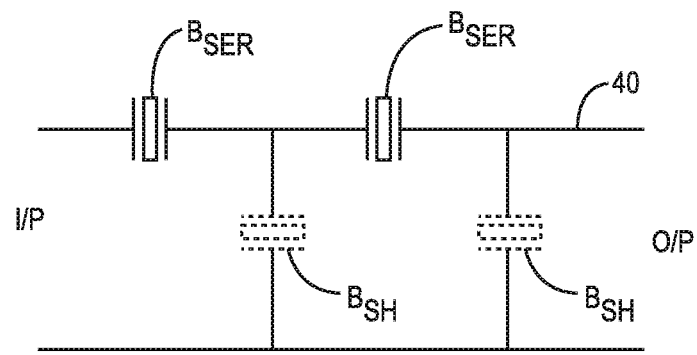
FIG. 5A is a schematic of a conventional ladder network.
Figure 5B:
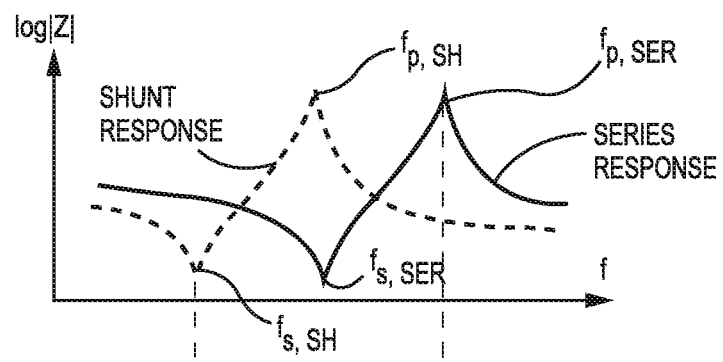
FIGS. 5B and 5C are graphs of a frequency response for BAW resonators in the conventional ladder network of FIG. 5A and a frequency response for the conventional ladder network of FIG. 5A.

As noted above, BAW resonators 10 are often used in filter networks that operate at high frequencies and require high Q values. A basic ladder network 40 is illustrated in FIG. 5A. The ladder network 40 includes two series resonators $B_{SER}$ and two shunt resonators $B_{SH}$, which are arranged in a traditional ladder configuration. Typically, the series resonators $B_{SER}$ have the same or similar first frequency response, and the shunt resonators $B_{SH}$ have the same or similar second frequency response, which is different than the first frequency response, as shown in FIG. 5B. In many applications, the shunt resonators $B_{SH}$ are detuned version of the series resonators $B_{SER}$. As a result, the frequency responses for the series resonators $B_{SER}$ and the shunt resonators $B_{SH}$ are generally very similar, yet shifted relative to one another such that the parallel resonance frequency ($f_{P,SH}$) of the shunt resonators approximates the series resonance frequency ($f_{S,SER}$) of the series resonators $B_{SER}$. Note that the series resonance frequency ($f_{S,SH}$) of the shunt resonators $B_{SH}$ is less than the series resonance frequency ($f_{S,SER}$) of the series resonators $B_{SER}$. The parallel resonance frequency ($f_{S,SH}$) of the shunt resonators $B_{SH}$ is less than the parallel resonance frequency ($f_{S,SER}$) of the series resonators $B_{SER}$.

Figure 5C:
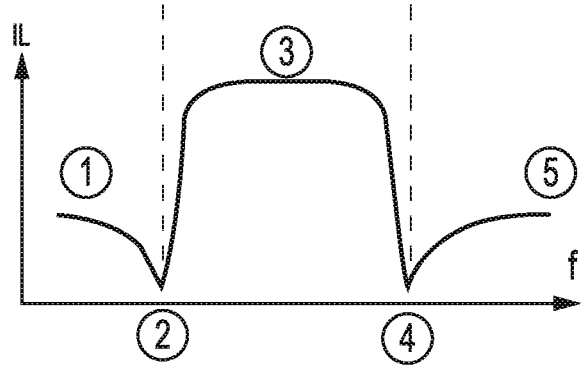

FIG. 5C is associated with FIG. 5B and illustrates the response of the ladder network 40. The series resonance frequency ($f_{S,SH}$) of the shunt resonators $B_{SH}$ corresponds to the low side of the passband's skirt (phase 2), and the parallel resonance frequency ($f_{P,SER}$) of the series resonators $B_{SER}$ corresponds to the high side of the passband's skirt (phase 4). The substantially aligned series resonance frequency ($f_{S,SER}$) of the series resonators $B_{SER}$ and the parallel resonance frequency ($f_{S,SH}$) of the shunt resonators $B_{SH}$ fall within the passband.

FIGS. 6A through 6E provide circuit equivalents for the five phases of the response of the ladder network 40. During the first phase (phase 1, FIGS. 5C, 6A), the ladder network 40 functions to attenuate the input signal. As the series resonance frequency ($f_{S,SH}$) of the shunt resonators $B_{SH}$ is approached, the impedance of the shunt resonators $B_{SH}$ drops precipitously, such that the shunt resonators $B_{SH}$ essentially provide a short to ground at the series resonance frequency ($f_{S,SH}$) of the shunt resonators (phase 2, FIGS. 5C, 6B). At the series resonance frequency ($f_{S,SH}$) of the shunt resonators $B_{SH}$ (phase 2), the input signal is essentially blocked from the output of the ladder network 40.

Figure 6A:
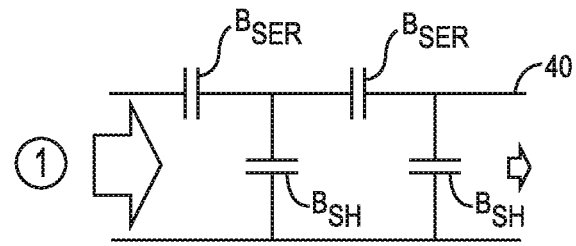
FIGS. 6A-6E are circuit equivalents for the ladder network of FIG. 5A at the frequency points 1, 2, 3, 4, and 5, which are identified in FIG. 5C.
Figure 6B:
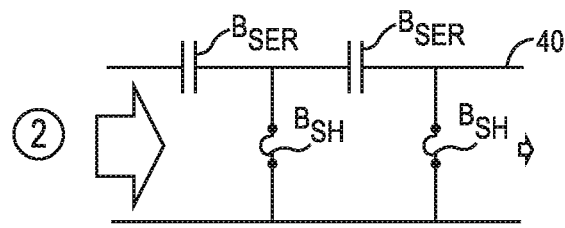
Figure 6C:
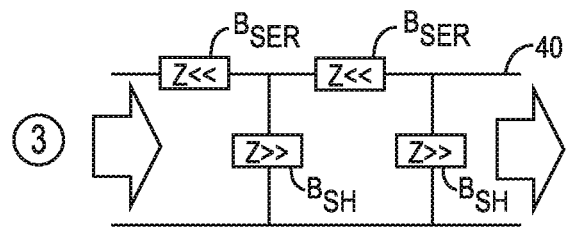
Figure 6D:
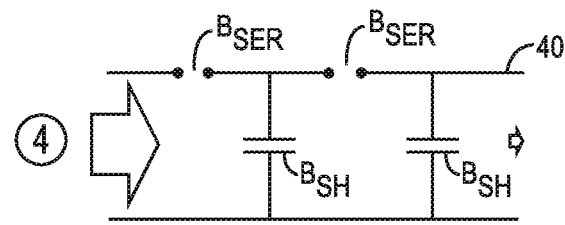
Figure 6E:
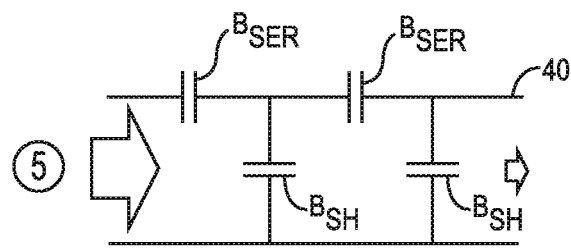

Between the series resonance frequency ($f_{S,SH}$) of the shunt resonators $B_{SH}$ and the parallel resonance frequency ($f_{P,SER}$) of the series resonators $B_{SER}$, which corresponds to the passband, the input signal is passed to the output with relatively little or no attenuation (phase 3, FIGS. 5C, 6C). Within the passband, the series resonators $B_{SER}$ present relatively low impedance, while the shunt resonators $B_{SH}$ present a relatively high impedance, wherein the combination of the two leads to a flat passband was steep low and high-side skirts. As the parallel resonance frequency ($f_{P,SER}$) of the series resonators $B_{SER}$ is approached, the impedance of the series resonators $B_{SER}$ becomes very high, such that the series resonators $B_{SER}$ essentially present themselves as an opening at the parallel resonance frequency ($f_{P,SER}$) of the series resonators (phase 4, FIGS. 5C, 6D). At the parallel resonance frequency ($f_{P,SER}$) of the series resonators $B_{SER}$ (phase 4), the input signal is again essentially blocked from the output of the ladder network 40. During the final phase (phase 5, FIGS. 5C, 6E), the ladder network 40 functions to attenuate the input signal, in a similar fashion to that provided in phase 1. As the parallel resonance frequency ($f_{P,SER}$) of the series resonators $B_{SER}$ is passed, the impedance of the series resonators $B_{SER}$ decreases, and the impedance of the shunt resonators $B_{SH}$ normalize. Thus, the ladder network 40 functions to provide a high Q passband between the series resonance frequency ($f_{S,SH}$) of the shunt resonators $B_{SH}$ and the parallel resonance frequency ($f_{P,SER}$) of the series resonators $B_{SER}$. The ladder network 40 provides extremely high attenuation at both the series resonance frequency ($f_{S,SH}$) of the shunt resonators $B_{SH}$ and the parallel resonance frequency ($f_{P,SER}$) of the series resonators. The ladder network 40 provides good attenuation below the series resonance frequency ($f_{S,SH}$) of the shunt resonators $B_{SH}$ and above the parallel resonance frequency ($f_{P,SER}$) of the series resonators $B_{SER}$.

Having provided an overview of BAW resonators and filters that employ BAW resonators, FIGS. 7A-11 discuss details of a BAW filter structure with internal electrostatic shielding.

Figure 7A:
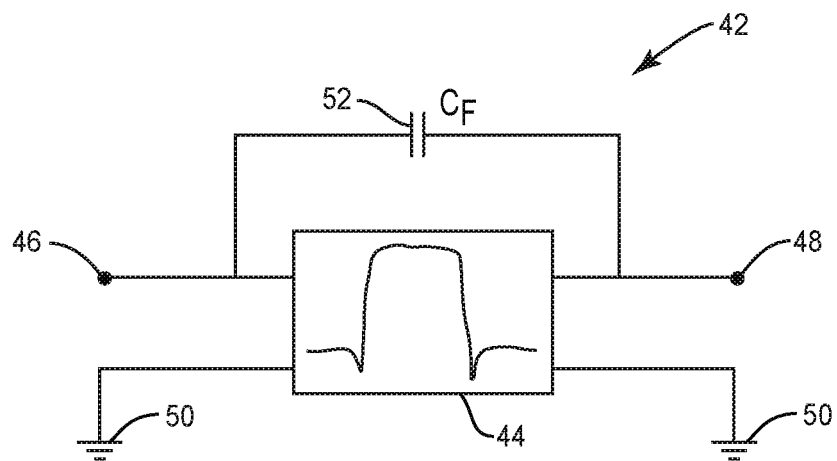
FIG. 7A is a general circuit diagram illustrating parasitic capacitance electrically coupled to a filter.

FIGS. 7A-7F illustrate use of an electrostatic shield on a BAW filter structure and the effect thereof. In particular, FIG. 7A is a general circuit diagram 42 illustrating parasitic capacitance electrically coupled to a filter 44. The filter 44 (e.g., a bandpass filter) is electrically coupled to an input node 46, an output node 48, and a ground node 50. An input signal is propagated from the input node 46 into the filter 44, and then an output signal is propagated from the filter 44 to the output node 48. In this example, a parasitic capacitance 52 (also referred to herein as capacitive parasitics, parasitic coupling, parasitic capacitance coupling, etc.) is formed between the input node 46 and the output node 48. In other words, the parasitic capacitance 52 is formed between two conductors. Specifically, this type of parasitic capacitance 52 is also known as capacitive feedthrough. Although capacitive feedthrough is shown and described, other types of parasitic capacitance 52 may be reduced by the electrostatic shield of the present disclosure (e.g. inter-stage coupling). As noted above, parasitic capacitance 52 can lead to filter rejection degradation and can negatively affect filter performance.

Figure 7B:
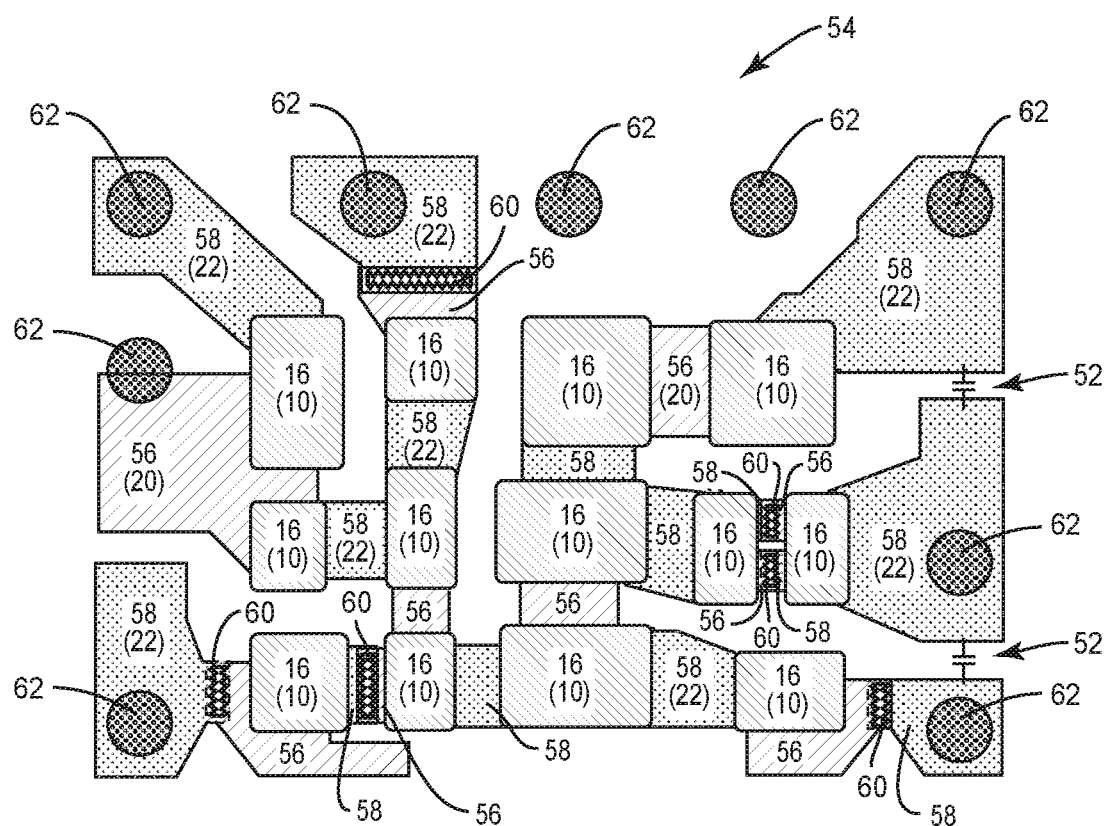
FIG. 7B is a top partial view of a first filter structure without electrostatic shielding, the first filter structure subject to parasitic capacitance, generally similar to (but different from) the parasitic capacitance shown in FIG. 7A.

FIG. 7B is a top partial view of a first filter structure 54 without electrostatic shielding. In particular, FIG. 7B illustrates a first partial filter structure 54 of a first filter 44. The first filter structure 54 is subject to parasitic capacitance 52 as similarly described above with respect to FIG. 7A. The first filter structure 54 (also referred to as a filter die, filter die layout, etc.) is a top partial view of a B7TX filter die layout illustrating a top electrode 20 (also referred to as a top electrode layer), a bottom electrode 22 (also referred to as a bottom electrode layer), and their respective transducers 16. Although a B7TX filter die layout is illustrated, any type of filter die layout may be used (e.g., B3TX filter die layout). Further, it is noted that the first partial filter die layout 54 omits the reflector 14 and the substrate 12 of the first filter 44 for illustrative purposes only. It is noted that the reflector 14 comprises a plurality of portions, with each portion positioned beneath and slightly larger than the respective transducer 16. In particular, the portion of the reflector 14 positioned beneath a first transducer 16 may be electrically isolated from the portion of the reflector 14 positioned beneath a second transducer 16.

As explained in more detail below, the top electrode 20 may include a plurality of physically separated portions, where each such portion may include an active portion (in the active region 24) and/or an interconnect 56 (in the outside region 26). Similarly, the bottom electrode 22 may include a plurality of physically separated portions, where each such portion may include an active portion (in the active region 24) and an interconnect 58 (in the outside region 26). As described in FIG. 1 above, the overlap of the active portions of top electrode 20 and the bottom electrode 22 form the active region 24 of the transducer 16. Each transducer 16 corresponds to a respective resonator 10. Accordingly, the first filter 44 includes thirteen transducers 16 and thirteen corresponding resonators 10.

Depending on the design and performance requirements of the filter 44, the interconnect 56 (also referred to herein as an interconnect portion) of the top electrode 20 and the interconnect 58 (also referred to herein as an interconnect portion) of the bottom electrode 58 may be physically and electrically connected to one another by an interconnect via 60 vertically extending between a portion of the interconnect 56 of the top electrode 20 and a portion of the interconnect 58 of the bottom electrode 58. Further, the interconnects 56, 58 may also be connected to connection vias 62 (also referred to herein as connection pins, connection pillars, metal pillar, etc.). The vias 62 provide an electrical connection to one or more input nodes 46, output nodes 48, and/or ground nodes 50. Accordingly, the interconnects 56, 58 physically and electrically connect the transducers 16 (and corresponding resonators 10) to each other, as well as to the one or more input nodes 46, output nodes 48, and/or ground nodes 50.

In the first filter 44, a plurality of parasitic capacitances 52 are located along the right side of the filter structure 54, in between the interconnects 58 of the bottom electrodes 22.

Note that the first filter 44 may include additional parasitic capacitances 52 in addition to those illustrated. In other words, the parasitic capacitances present in the first filter 44 are not limited to those shown. As explained above, these parasitic capacitances 52 negatively affect filter performance (e.g., filter rejection degradation).

Figure 7C:
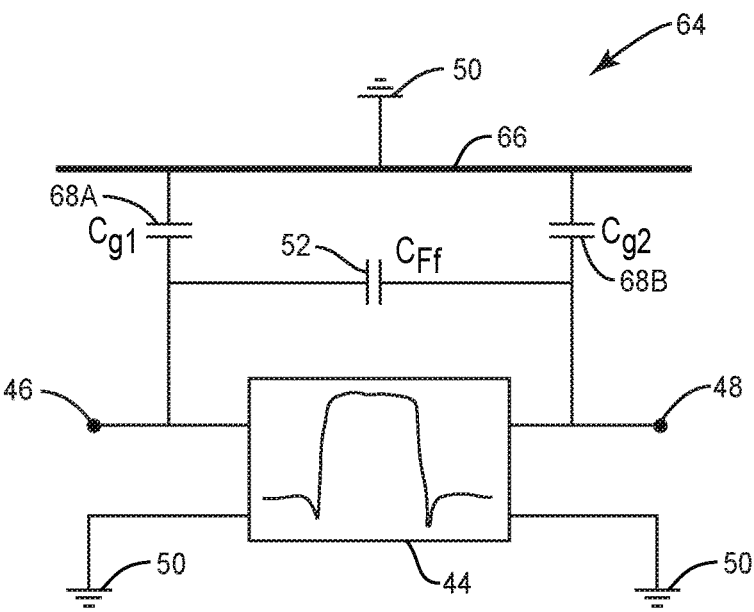
FIG. 7C is a general circuit diagram illustrating inclusion of electrostatic shielding to reduce the effect of parasitic capacitance on the filter of FIG. 7A.

FIG. 7C is a general circuit diagram 64 illustrating inclusion of an electrostatic shield 66 to reduce the effect of parasitic capacitance 52 on the filter 44 of FIG. 7A. The electrostatic shield 66 (also referred to herein as a electrostatic shielding, grounded conductor, electrostatic shielding layer, planar electrostatic shield, etc.) is formed from a grounded conductor (e.g., grounded metal conductor, grounded metal layer, etc.) and may be planar (although other shapes may be used). However, a planar electrostatic shield 66 is easy to manufacture and integrate into the BAW filter structure 54. The electrostatic shield 66 is configured and positioned to interrupt (also referred to herein as disrupt, disturb, interfere, etc.) an electrical field associated with the parasitic capacitance of the filter to reduce the parasitic capacitance. It is noted that the electrostatic shield 66 may form one or more shield capacitances 68A, 68B (also referred to herein as shield capacitance coupling, etc.) with the filter 44. In other words, the electrostatic shield 66 is positioned within the vicinity of the two conductors between which the parasitic capacitance 52 exists. In this way, at least some of the electric field lines initially emanating from the first conductor and terminating at the second conductor instead terminate at the electrostatic shield 66, such that the undesirable parasitic capacitance 52 is greatly diminished and the desired filter rejection is restored. In this example, the electrostatic shield 66 forms a first shield capacitance 68A with the input node 46 (e.g., on one side of the parasitic capacitance 52) and a second shield capacitance 68B with the output node 48 (e.g., on the other side of the parasitic capacitance 52). Of course, fewer or more shield capacitances may result. For example, in certain embodiments, the electrostatic shield 66 only forms a first shield capacitance 68A (and does not form a second shield capacitance 68B).

Positioning of the electrostatic shield 66 proximate to or within the electrical field (also referred to herein as a parasitic electrical field, parasitic electrical field lines, etc.) forming the parasitic capacitance 52 significantly reduces (or weakens) the parasitic capacitance 52. This reduction in parasitic capacitance 52 also reduces the effect (or influence) of the parasitic capacitance 52 on the filter 44, thereby improving filter performance and reducing rejection degradation (explained below in more detail). In certain embodiments, the magnitude (or strength) of at least one of the shield capacitances 68A, 68B may be much greater than the parasitic capacitance 52.

Figure 7D:
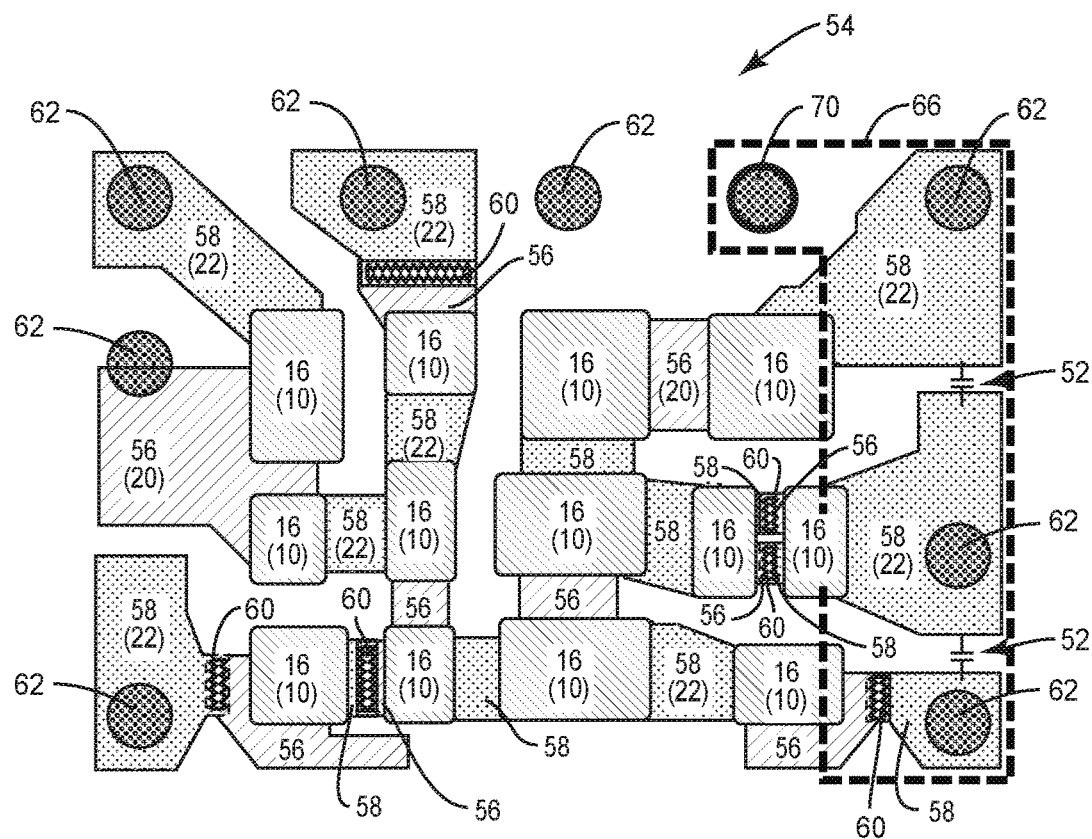
FIG. 7D is a top partial view of the first filter structure of FIG. 7B including electrostatic shielding to reduce the effect of parasitic capacitance.

FIG. 7D is a top partial view of the first filter 44 of FIG. 7B including a first electrostatic shield 66 to reduce the effect of parasitic capacitance 52. The first electrostatic shield 66 includes a shielding via 70 (also referred to as a shielding pin, shielding pillar, metal shielding pillar, etc.). The configuration (e.g., size, shape, and location) of the first electrostatic shield 66 may vary depending on the performance requirements of the filter structure 54 and the location of the parasitic capacitance 52. In particular, the first electrostatic shield 66 is configured for placement proximate to and/or over one or both ends of the parasitic capacitance 52 (e.g., proximate to or within the electrical field forming the parasitic capacitance 52) to reduce the magnitude thereof. For example, in the first filter 44, as mentioned above, a plurality of parasitic capacitances 52 are located along the right side of the filter structure 54, in between the interconnects 58 of the bottom electrodes 22. However, the parasitic capacitances 52 within the first filter 44 are not limited to those shown and may include additional parasitic capacitances 52 within the first filter 44. The first electrostatic shield 66 is configured to be positioned along the right side of the filter structure 54 to weaken the magnitude of the parasitic capacitance 52 therebetween. It is noted that the shield capacitances 68A, 68B of the first electrostatic shield 66 may affect performance of the filter structure 54, thereby requiring selectivity in the configuration (e.g., size, shape, and location) of the first electrostatic shield 66. For example, in certain embodiments, it may not be possible to have a first electrostatic shield 66 spanning the entire footprint (e.g., width and length) of the filter structure 54.

In this example, the electrostatic shield 66 is vertically positioned between the reflector 14 (also referred to herein as a reflector structure, reflector layer, etc.) and the substrate 12 (also referred to herein as a substrate layer, etc.). In other words, the electrostatic shield 66 is positioned at a bottom (i.e., bottom surface) of the reflector. An advantage to such a configuration is increased flexibility in design (e.g., size and shape) of the electrostatic shield 66. As explained below in more detail, the electrostatic shield 66 may be vertically positioned elsewhere within the BAW filter structure 54.

Figure 7E:
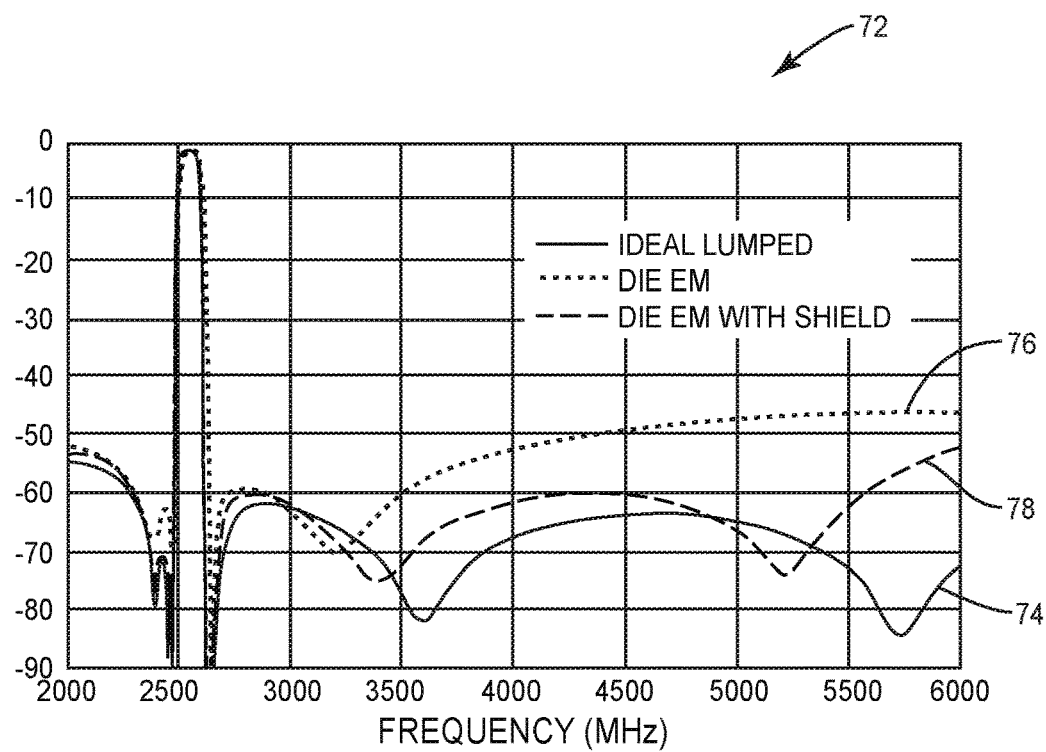
FIG. 7E is a graph comparing the effect of electrostatic shielding on filter rejection for the first filter structure of FIGS. 7B and 7D.

FIG. 7E is a graph 72 comparing the effect of electrostatic shielding on filter rejection for the first filter 44 of FIGS. 7B and 7D. In particular, the graph 72 illustrates filter performance between frequencies of 2000 MHz and 6000 MHz. An ideal lumped 74 provides the ideal filter performance for the first filter 44 with no parasitic capacitance 52 (or other unwanted interference). A die em 76 represents an unshielded first filter 44 (as shown in FIG. 7B) illustrating the effect of parasitic capacitance 52 on filter performance. A die em with shield 78 represents a shielded first filter 44 (as shown in FIG. 7D) with first electrostatic shield 66 reducing the effect of parasitic capacitance 52. As shown, the die em with shield 78 of the shielded first filter 44 is much closer to the ideal lumped 74 than the die em 76 of the unshielded first filter 44.

Figure 7F:
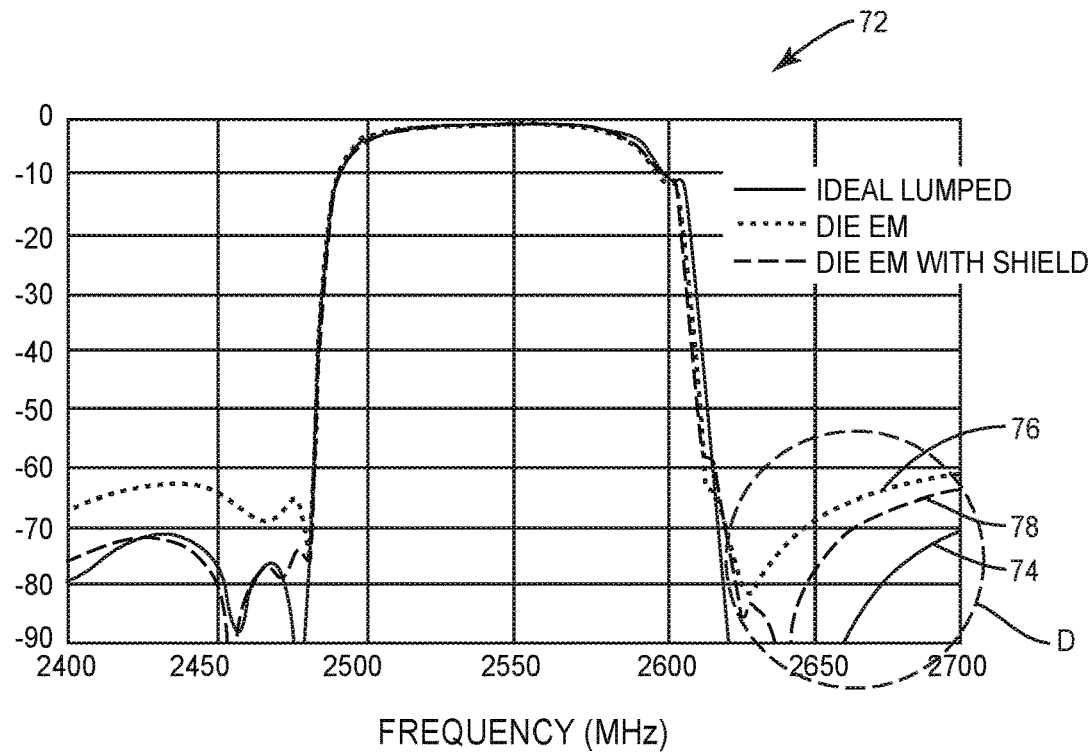
FIG. 7F is a graph illustrating an enlarged portion of the graph of FIG. 7E.

FIG. 7F is a graph 72 illustrating an enlarged portion of the graph of FIG. 7E. In particular, the graph 72 illustrates filter performance between frequencies of 2400 MHz and 2700 MHz. As highlighted in circle D, filter rejection degradation is significantly reduced for the die em with shield 78 of the shielded first filter 44 compared to the die em 76 of the unshielded first filter 44.

FIGS. 8A-8D are views illustrating vertical positioning of the electrostatic shield 66 within the BAW resonator 10. Further, it is noted that although a BAW resonator 10 with a reflector 14 is shown and described, the planar electrostatic shield 66 may be used with other types of BAW resonators (e.g., FBAR, etc.).

Figure 8A:
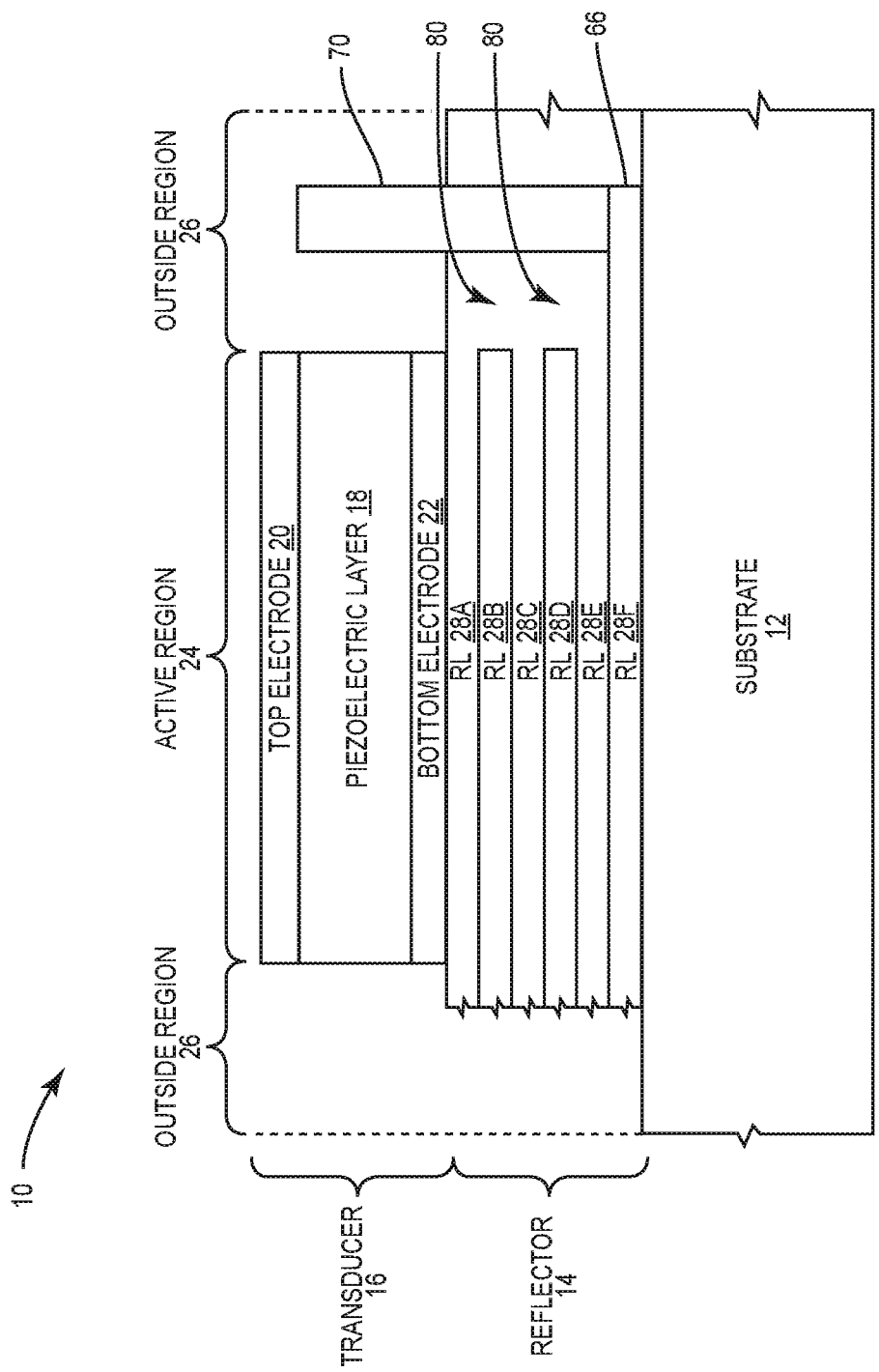
FIG. 8A is a cross-sectional view of a portion of a BAW resonator illustrating a first embodiment of the electrostatic shield of FIGS. 7C and 7D positioned at a bottom of the reflector of the BAW resonator.

FIG. 8A is a cross-sectional view of a portion of a BAW resonator 10 illustrating a first embodiment of the electrostatic shield 66 of FIGS. 7C and 7D positioned at a bottom (i.e., bottom surface) of a reflector 14 of the BAW resonator 10. As mentioned above, typically, the reflector layers 28A through 28F alternate between materials having high and low acoustic impedances, such as tungsten (W) and silicon dioxide (SiO2), as tungsten is generally conductive and silicon dioxide is generally insulative (e.g., dielectric). Accordingly, the reflector layers 28A through 28F also alternate between conductive and insulative materials (e.g., dielectric materials). In other words, reflector layers 28A, 28C, and 28E include silicon dioxide and are insulative, while reflector layers 28B, 28D, and 28F include tungsten and are conductive.

In this embodiment, reflector layer 28F forms the electrostatic shield 66 with a generally planar shape, although other shapes may be used (e.g., contoured, textured, etc.). Further, the planar electrostatic shield 66 is substantially parallel to a top surface of the substrate 12, bottom electrode 22, piezoelectric layer 18, and/or top electrode 20. Alternatively, in certain embodiments, an electrostatic shield 66, separate from the reflector 14, may be positioned between the reflector 14 and the substrate 12 at a bottom of the reflector 14. In the current embodiment, reflector layer 28F extends from the active region 24 (e.g., at least a portion of the electrostatic shield 66 vertically aligned with the active region 24) into the outside region 26 (e.g., at least a portion of the electrostatic shield 66 vertically aligned with the outside region 26) to provide a contact point for a shielding via 70 of the electrostatic shield 66. In particular, the shielding via 70 is physically and electrically connected to the electrostatic shield 66 (in the outside region 26 of the reflector layer 28F) and extends from a top surface thereof through a top surface of the reflector 14. In this way, the shielding via 70 is configured to form a grounding connection and thereby ground the electrostatic shield 66. The electrostatic shield 66 is shown as extending between the active region 24 and the outside region 26, but alternatively the electrostatic shield 66 may be in only one of the active region 24 or only the outside region 26.

As mentioned above, the reflector layers 28A through 28F alternate between conductive materials (e.g., tungsten) and insulative materials (e.g., silicon dioxide). As a result, a gap 80 is formed between reflector layers 28B and 28D and the shielding via 70 because reflector layers 28B and 28D are conductive. For example, in certain embodiments, the gaps 80 include silicon dioxide. Similar gaps may be positioned within reflector layer 28F to more specifically shape the electrostatic shield 66. Further, in this embodiment, the piezoelectric layer 18 is illustrated as being within the active region 24. However, as explained in more detail below, in other embodiments, the piezoelectric layer 18 extends into the outside region 26. In such an embodiment, the shielding via 70 may also extend upwardly from a top of the reflector 14 through a bottom of the piezoelectric layer 18 through the piezoelectric layer 18 to a top of the piezoelectric layer 18.

Figure 8B:
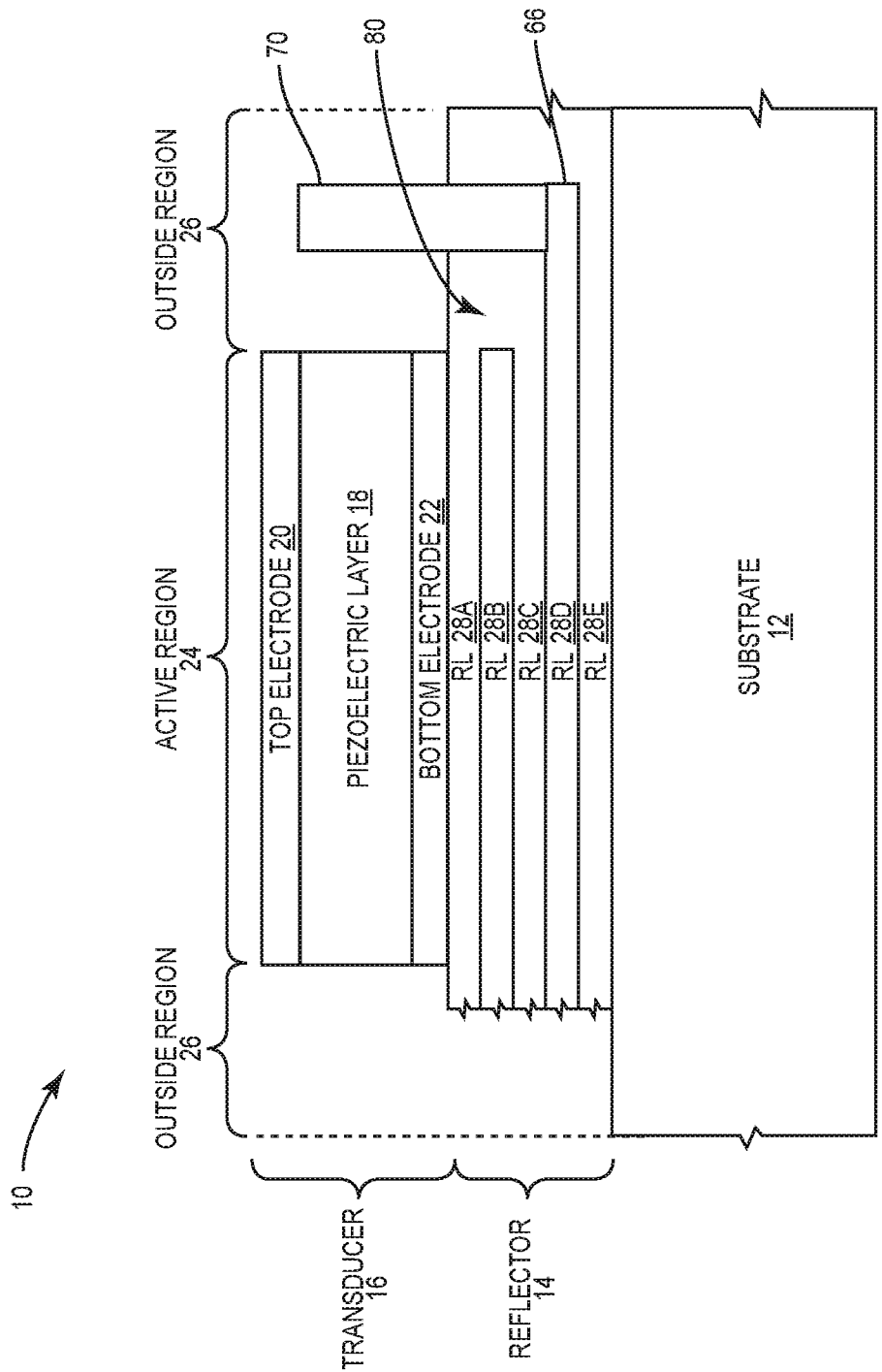
FIG. 8B is a cross-sectional view of a portion of a BAW resonator illustrating a second embodiment of the electrostatic shield of FIGS. 7C and 7D formed by a first conductive reflector layer within the reflector of the BAW resonator.
Figure 8C:
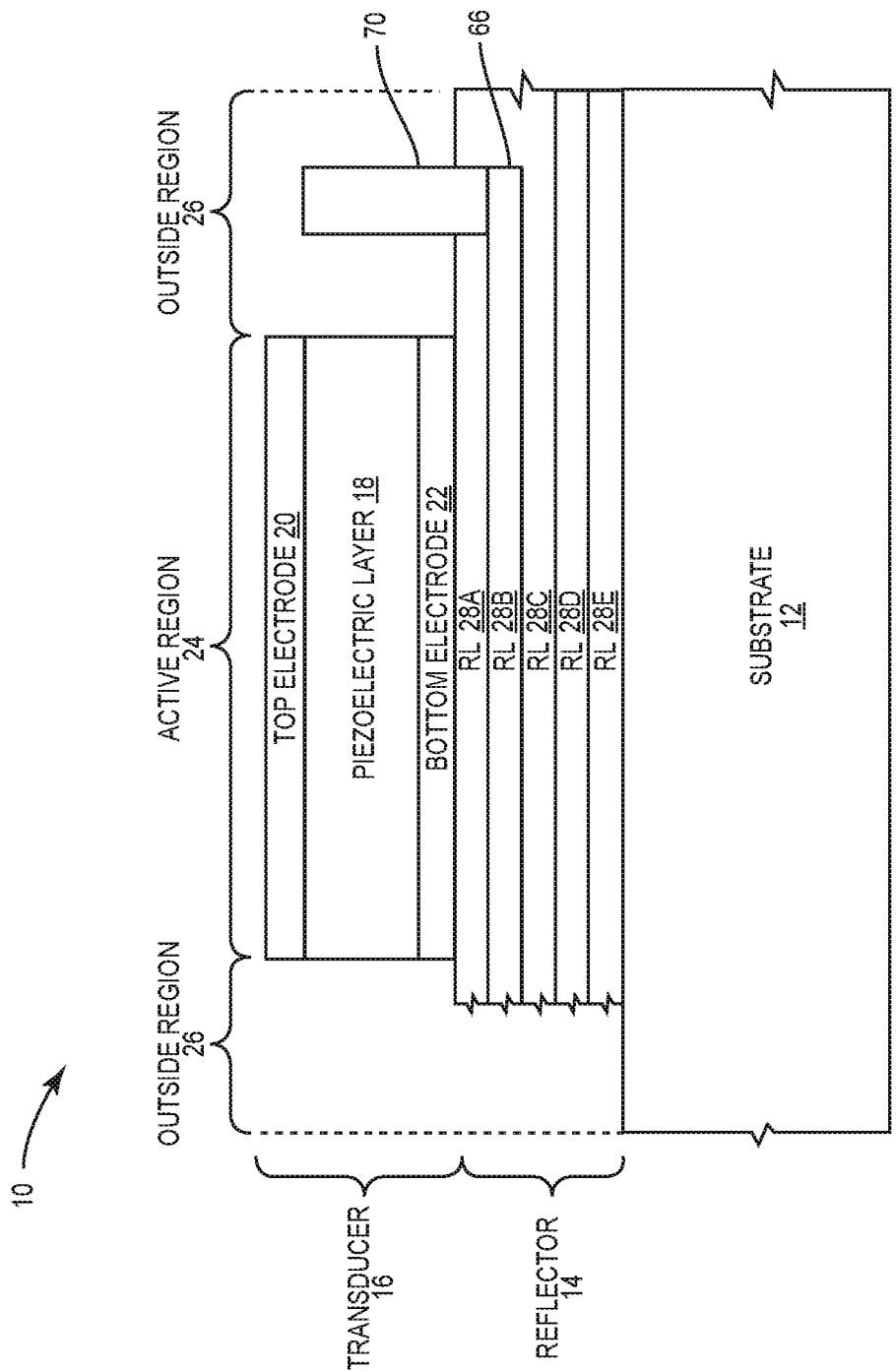
FIG. 8C is a cross-sectional view of a portion of a BAW resonator illustrating a third embodiment of the electrostatic shield of FIGS. 7C and 7D formed by a second conductive reflector layer within the reflector of the BAW resonator.

FIGS. 8B-8C are views of a portion of a BAW resonator 10 illustrating forming an electrostatic shield 66 by conductive reflector layers within the reflector 14 of the BAW resonator 10. In particular, FIG. 8B is a cross-sectional view of a portion of a BAW resonator 10 illustrating a second embodiment of the electrostatic shield 66 of FIGS. 7C and 7D formed by a first conductive reflector layer 28D within the reflector 14 of the BAW resonator. The electrostatic shield 66 and shielding via 70 are the same as that discussed in FIG. 8A above, except where noted otherwise. In this embodiment, the reflector 14 includes five reflector layers 28A-28E with alternating layers of conductive materials (e.g., tungsten) and insulative materials (e.g., silicon dioxide). In other words, reflector layers 28A, 28C, and 28E are insulative and reflector layers 28B and 28D are conductive. In this embodiment, reflector layer 28D (positioned below conductive reflector layer 28B) forms the electrostatic shield 66. As with FIG. 8A above, a gap 80 is formed between reflector layer 28B and the shielding via 70.

FIG. 8C is a cross-sectional view of a portion of a BAW resonator 10 illustrating a third embodiment of the electrostatic shield 66 of FIGS. 7C and 7D formed by a second conductive reflector layer of the reflector 14 of the BAW resonator 10. The electrostatic shield 66 and shielding via 70 are the same as those discussed in FIG. 8B above, except where noted otherwise. In this embodiment, reflector layer 28B forms the electrostatic shield 66. Unlike the embodiment of FIG. 8B discussed above, a gap 80 (not shown) is not required in this embodiment because reflector layer 28B is the uppermost conductive layer within the reflector 14. It is noted that although conductive reflector layer 28D is illustrated as extending from the active region 24 into the outside region 26, in certain embodiments the conductive reflective layers (e.g., reflector layer 28D) are limited to the boundary of the active region 24 or a portion proximate thereto (e.g., the conductive reflector layers extend from the active region 24 to a point just beyond the active region 24).

Figure 8D:
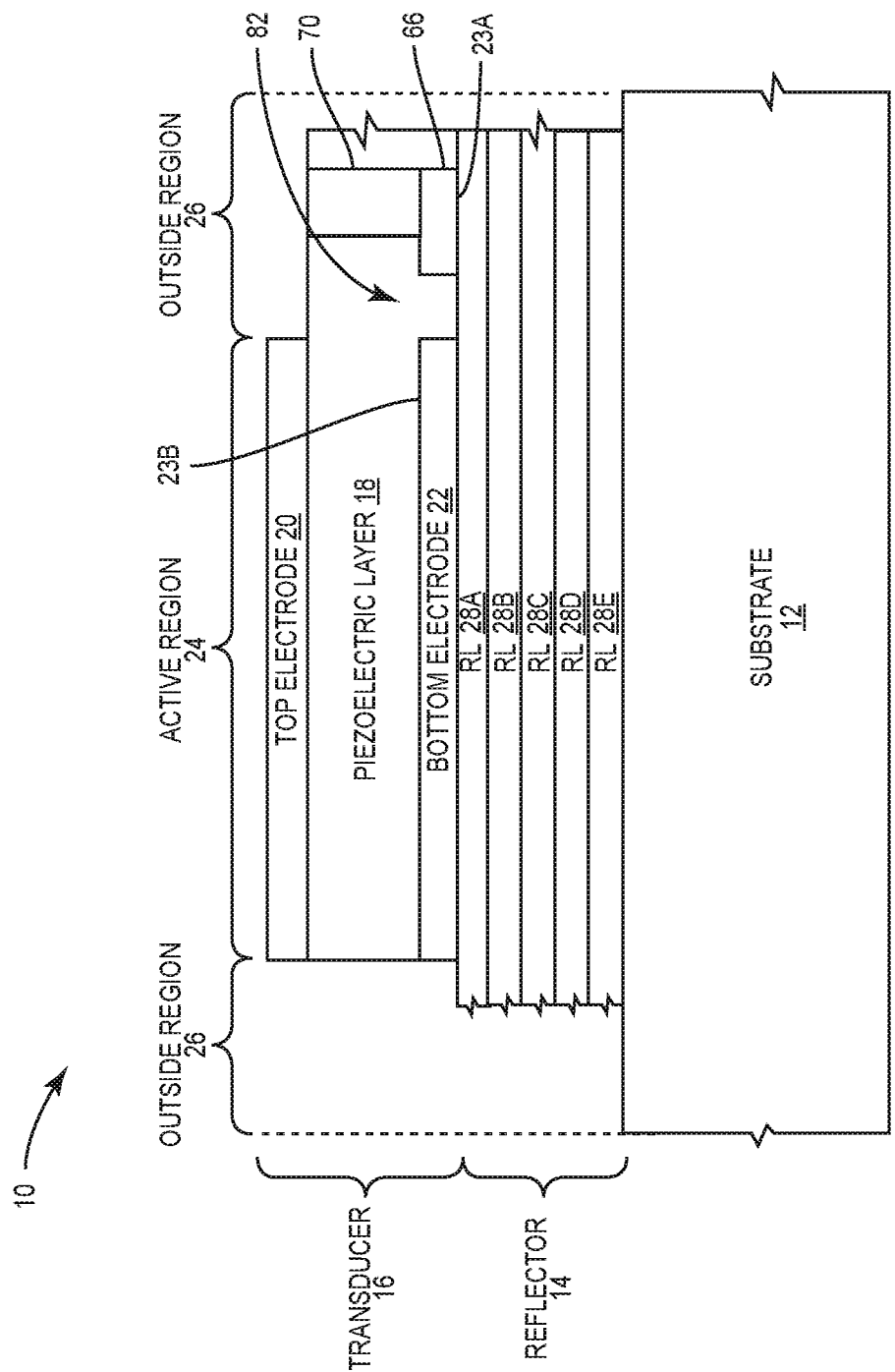
FIG. 8D is a cross-sectional view of a portion of a BAW resonator illustrating a fourth embodiment of the electrostatic shield of FIGS. 7C and 7D formed by an outside portion of a bottom electrode at a top of the reflector, the outside portion of the bottom electrode physically separated from the active portion of the bottom electrode.

FIG. 8D is a cross-sectional view of a portion of a BAW resonator 10 illustrating a fourth embodiment of the electrostatic shield 66 of FIGS. 7C and 7D formed by an outside portion 23A of a bottom electrode 22 physically separated from the active portion 23B of the bottom electrode 22. The electrostatic shield 66 is positioned at a top (i.e., top surface) of the reflector 14. The electrostatic shield 66 and shielding via 70 are the same as those discussed in FIG. 8C above, except where noted otherwise. In this embodiment, the outside portion 23A of the bottom electrode 22 forms the electrostatic shield 66. In particular, the bottom electrode 22 includes an active portion 23B forming part of the transducer 16 of the resonator 10 and an outside portion 23A which is physically separated and electrically disconnected from the active portion 23B by a gap 82. In this way, the electrostatic shield 66 is formed at a top of the reflector 14.

The reflector layers 28A-28E do not include gaps as with the previous embodiments because the shielding via 70 is positioned at a top of the reflector 14 and does not extend through the reflector 14. It is noted that although conductive reflector layers 28B and 28D are illustrated as extending from the active region 24 into the outside region 26, in certain embodiments the conductive reflective layers (e.g., reflector layers 28B, 28D) are limited to the boundary of the active region 24 or a portion proximate thereto (e.g., the conductive reflector layers 28B, 28D extend from the active region 24 to a point just beyond the active region 24).

Unlike other embodiments discussed above, the piezoelectric layer 18 extends beyond the active region 24 into the outside region 26, such that the shielding via 70 extends from the outside portion 23A of the bottom electrode 22 upward through the piezoelectric layer 18. However, it is noted that like other embodiments disclosed herein, the piezoelectric layer 18 may end at or proximate the active region 24 and not extend into the outside region 26.

Figure 9A:
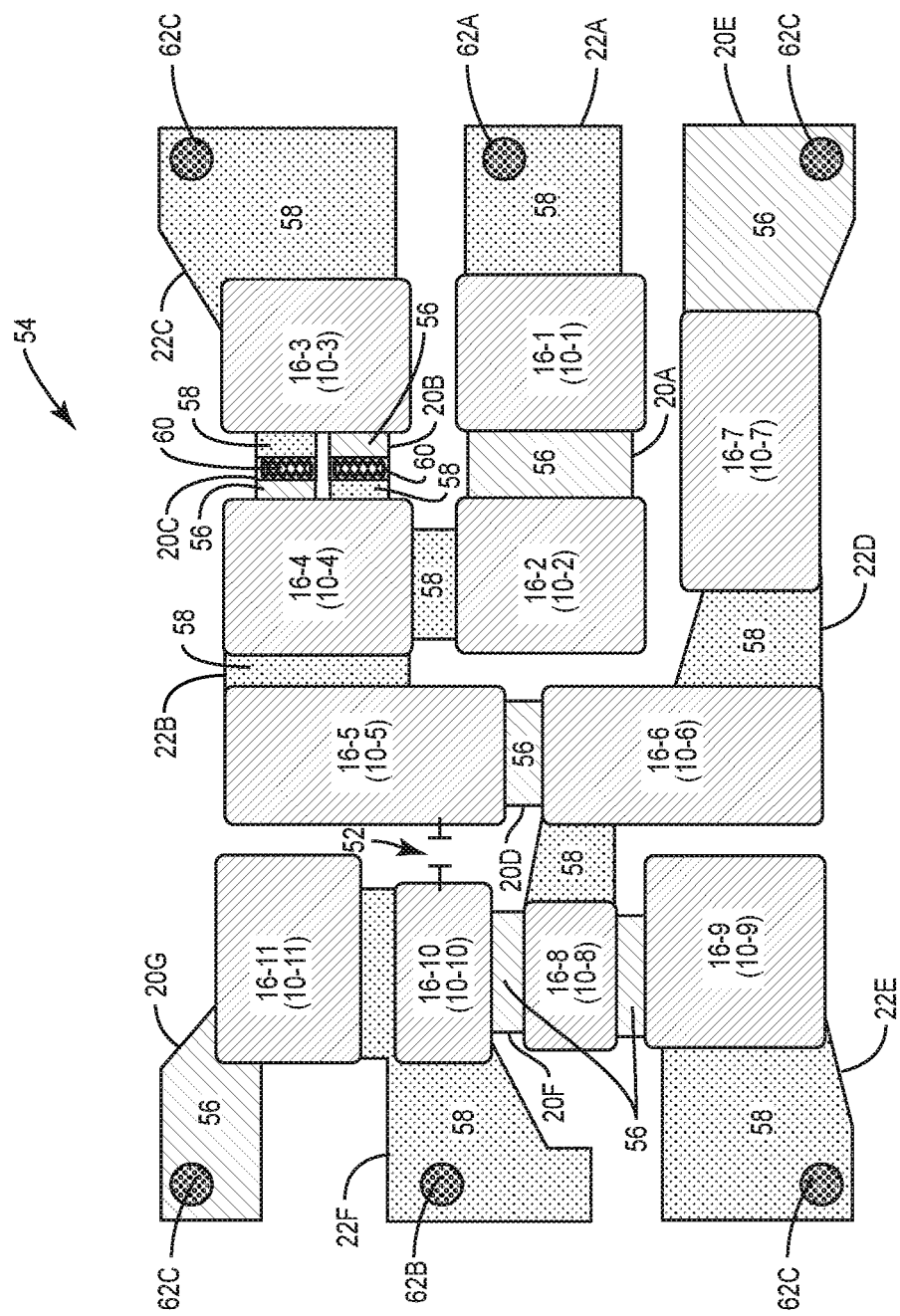
FIG. 9A is a top partial view of a second filter without electrostatic shielding, the second filter subject to parasitic capacitance, generally similar to (but different from) the parasitic capacitance shown in FIG. 7A.
Figure 9B:
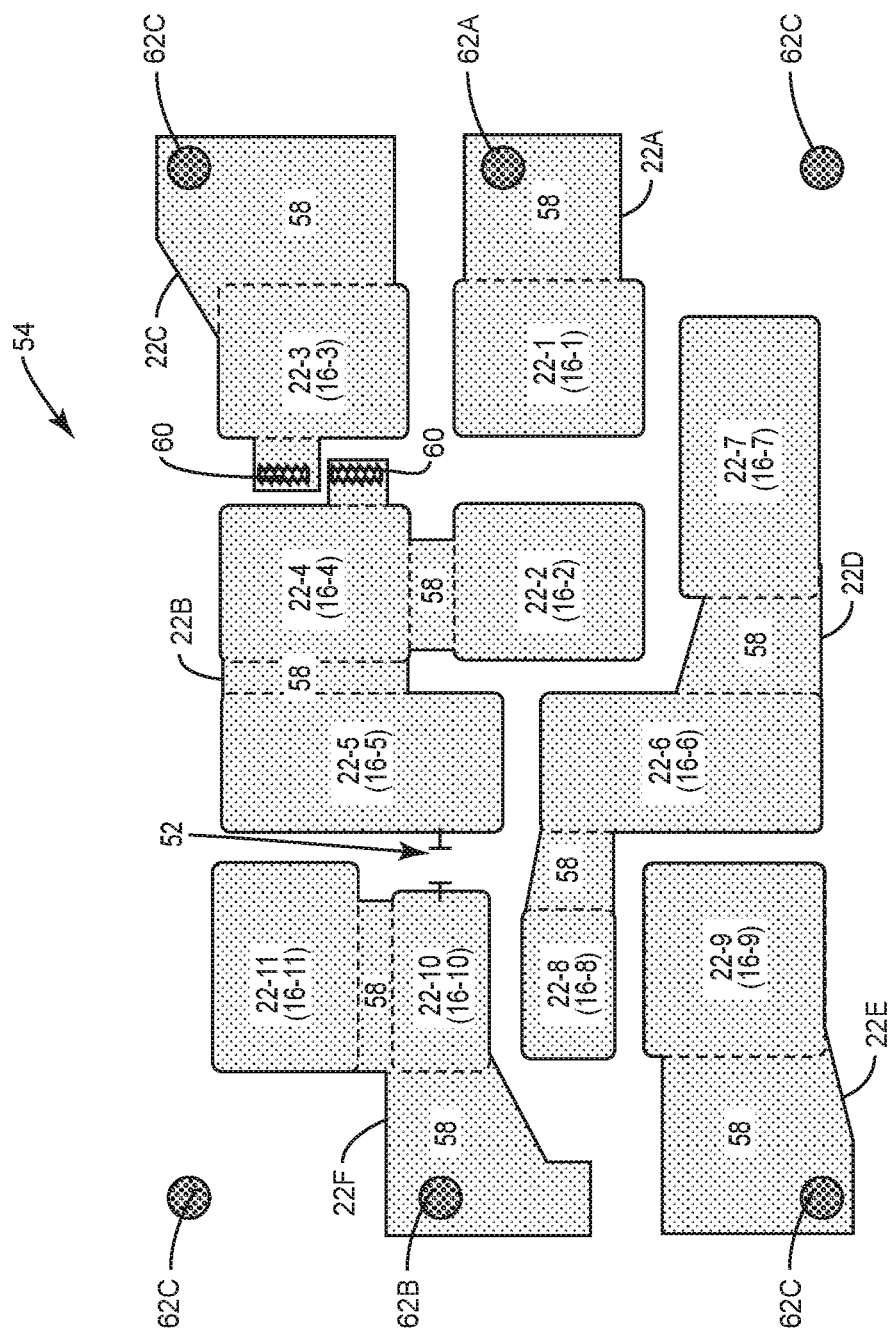
FIG. 9B is a top view of a bottom electrode layer of the second filter of FIG. 9A.
Figure 9C:
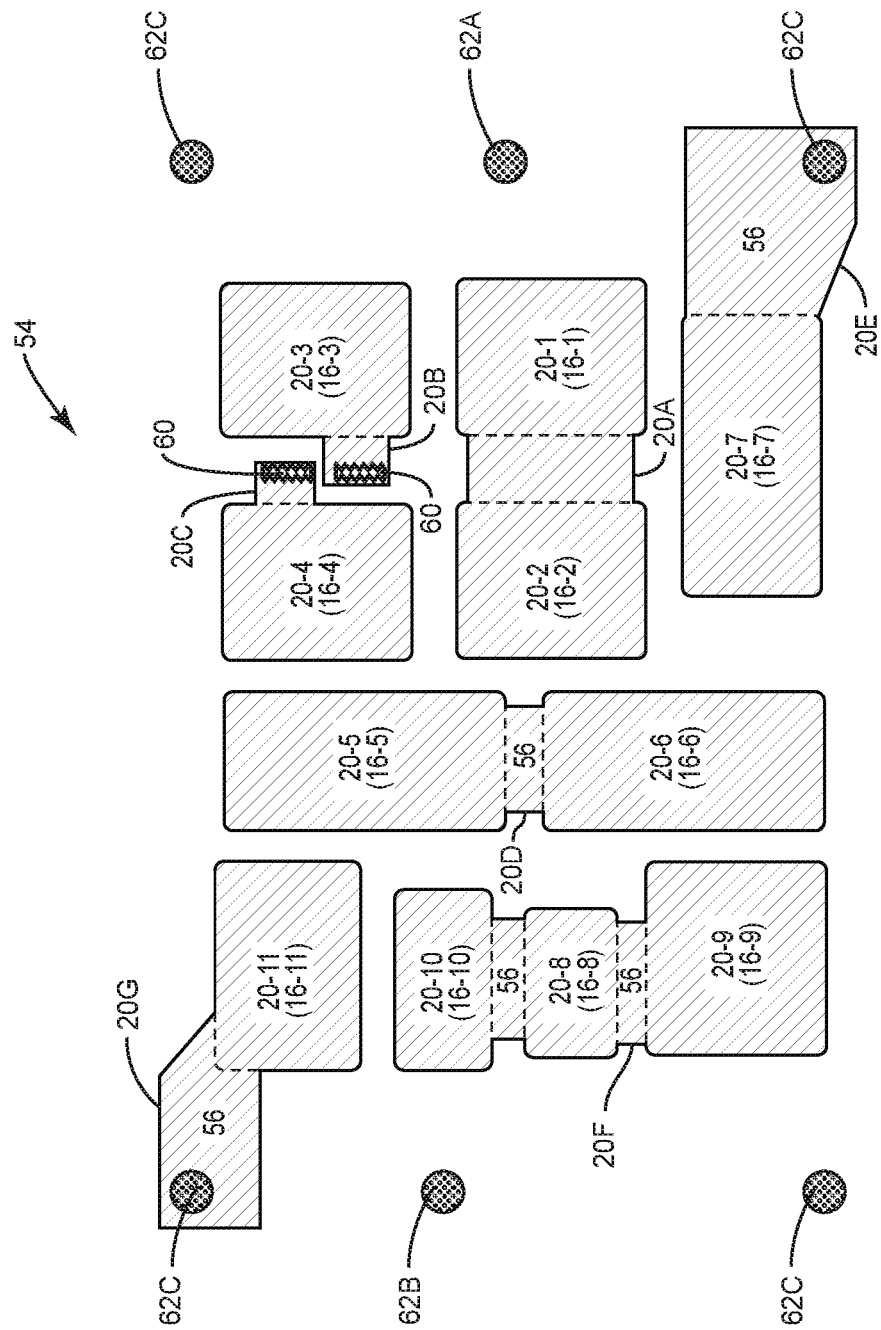
FIG. 9C is a top view of a top electrode layer of the second filter of FIG. 9A.

FIGS. 9A-9F are views of a second filter 44 without and with electrostatic shield 66. In particular, FIGS. 9A-9C are views of a second partial filter structure 54 of a second filter 44 without electrostatic shield 66. FIG. 9A is a top partial view of the second partial filter structure 54 of the second filter 44 without electrostatic shield 66. The second filter 44 includes a plurality of transducers 16-1 to 16-11 of a plurality of resonators 10-1 to 10-11 which are physically and electrically connected to each other by interconnects 56 of the top electrode 22 and interconnects 58 of the bottom electrode 22. In other words, interconnects 56, 58 are the portions of the top electrode 20 and the bottom electrode 22 which do not overlap with each other and which do not thereby form an active region 24. A parasitic capacitance 52 occurs between transducer 16-10 and transducer 16-5. Further, the plurality of transducers 16-1 to 16-11 of the plurality of resonators 10-1 to 10-11 are physically and electrically connected to an input via 62A, an output via 62B, and a plurality of ground vias 62C.

FIG. 9B is a top view of a bottom electrode 22 of the second filter 44 of FIG. 9A. The bottom electrode 22 includes a plurality of portions 22A-22F, where each portion 22A-22F is physically separated from one another. As explained in more detail below, each of these portions 22A-22F forms a different electrical node in the filter 44. Further, each of these portions 22A-22F includes an active portion 22-1 to 22-11 and an interconnect 58. FIG. 9C is a top view of a top electrode layer 20 of the second filter 44 of FIG. 9A. The top electrode 20 includes a plurality of portions 20A-20F, where each portion 20A-20F is physically separated from one another. As explained in more detail below, each of these portions 20A-20F forms a different electrical node in the filter 44.

Figure 9D:
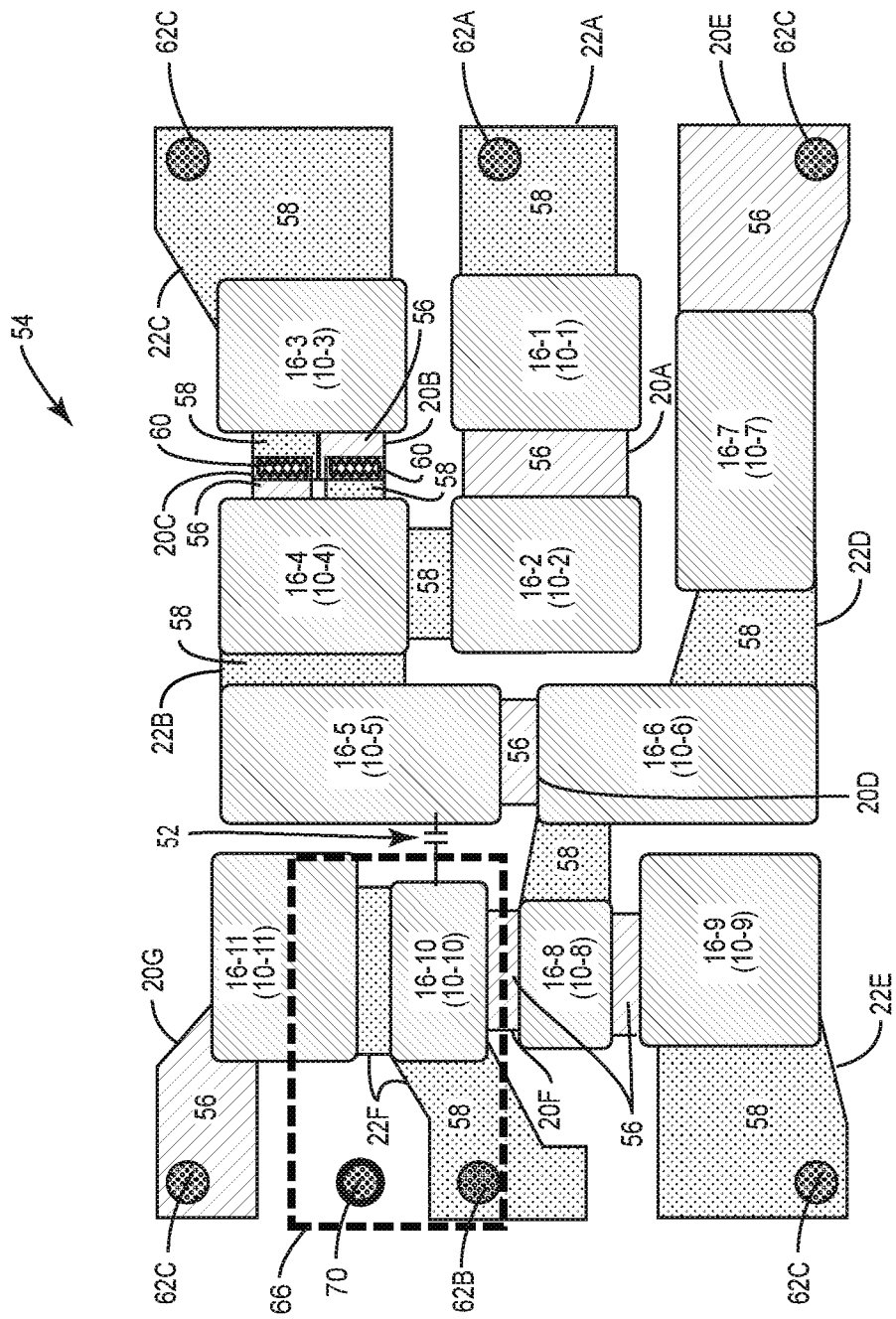
FIG. 9D is a top partial view of the second filter of FIG. 9A with electrostatic shielding reducing the effect of parasitic capacitance as similarly illustrated in FIG. 7C.

FIG. 9D is a top partial view of the second filter 44 of FIG. 9A with electrostatic shield 66 reducing the effect of parasitic capacitance 52. The electrostatic shield 66 is configured and positioned to cover transducer 16-10 (and corresponding resonator 10-10) and a portion of transducer 16-11 (and corresponding resonator 10-11). In this way, the electrostatic shield 66 is positioned proximate to or within an electrical field forming the parasitic capacitance 52. Incidentally, the electrostatic shield 66 forms a shield capacitance between ground and an electrical node that includes transducer 16-10 (and corresponding resonator 10-10), transducer 16-11 (and corresponding resonator 10-11) and interconnect 58. It is noted that interconnect 58 of bottom electrode portion 22F was modified to make sufficient space for the shielding via 70 of the electrostatic shield 66.

Figure 9E:
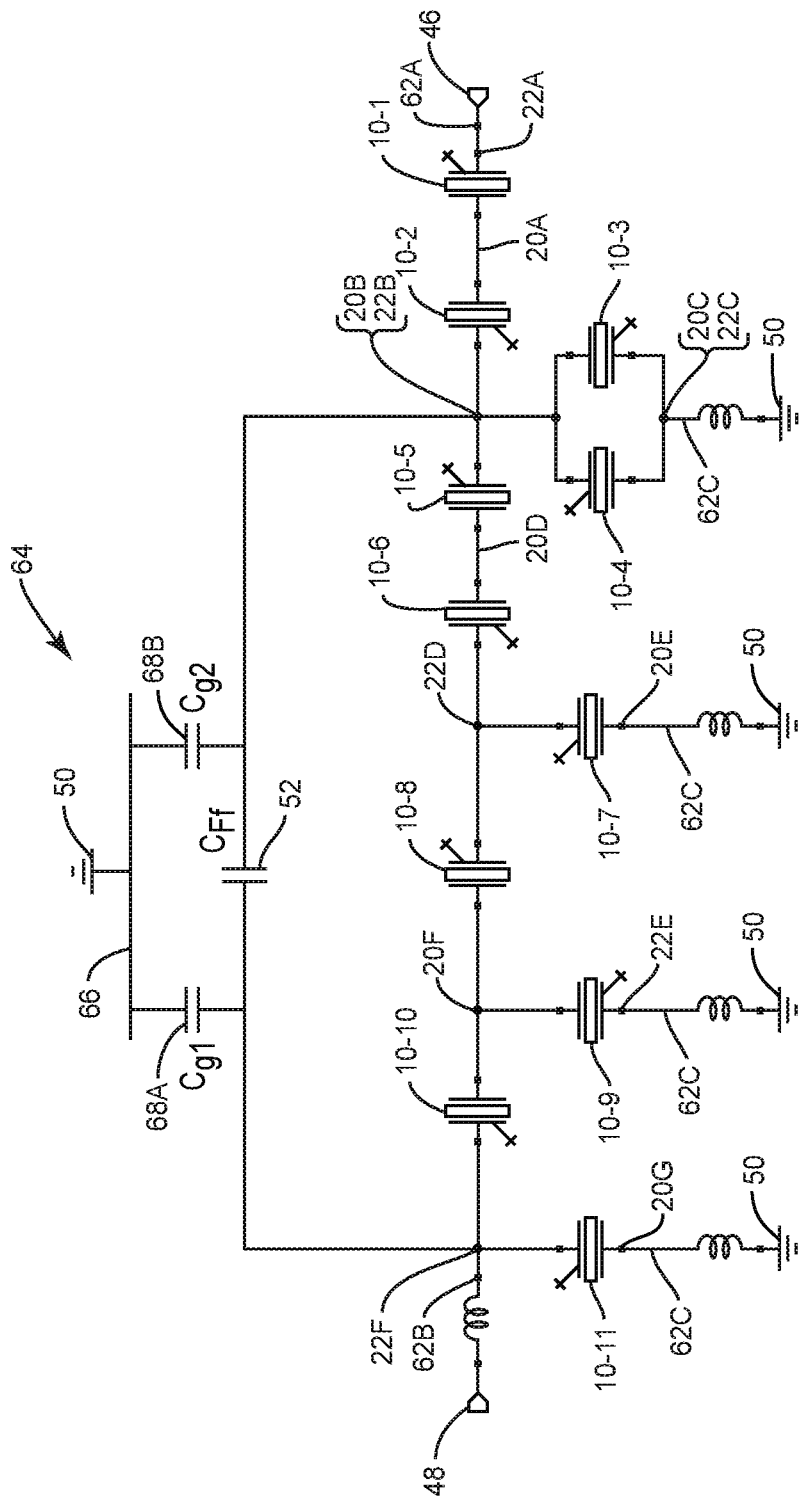
FIG. 9E is a circuit diagram of the second filter of FIG. 9D.

FIG. 9E is a circuit diagram 64 of the second filter of FIG. 9D. The configuration and positioning of the electrostatic shield 66 within or proximate the electrical field forming the parasitic capacitance 52 reduces the strength and influence of the parasitic capacitance 52 on the filter 44. The shield capacitance 68A formed by the electrostatic shield 66 is much greater than the parasitic capacitance 52, and shield capacitance 68B is much less. It is noted that each portion 22A-22F of the bottom electrode 22 and each portion 20A-20F of the top electrode 20 forms an electrical node within the circuit diagram of FIG. 9E.

Figure 9F:
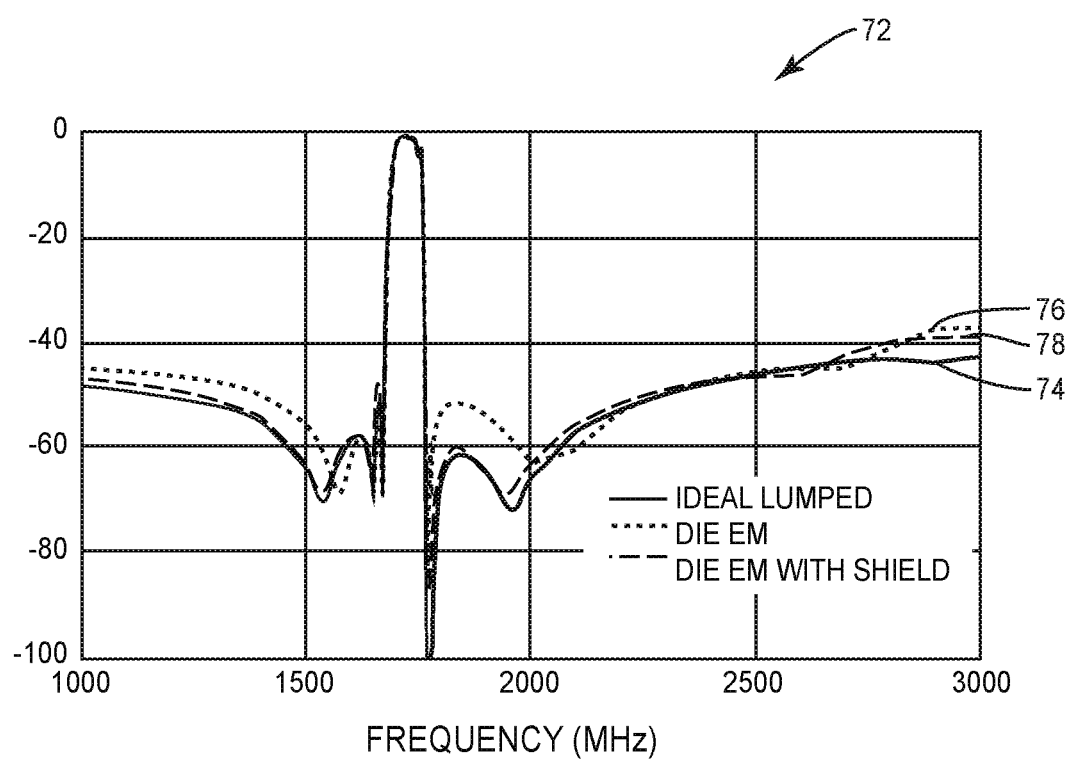
FIG. 9F is a graph comparing the effect of electrostatic shielding on filter rejection of the second filter of FIGS. 9A-9E.
Figure 10A:
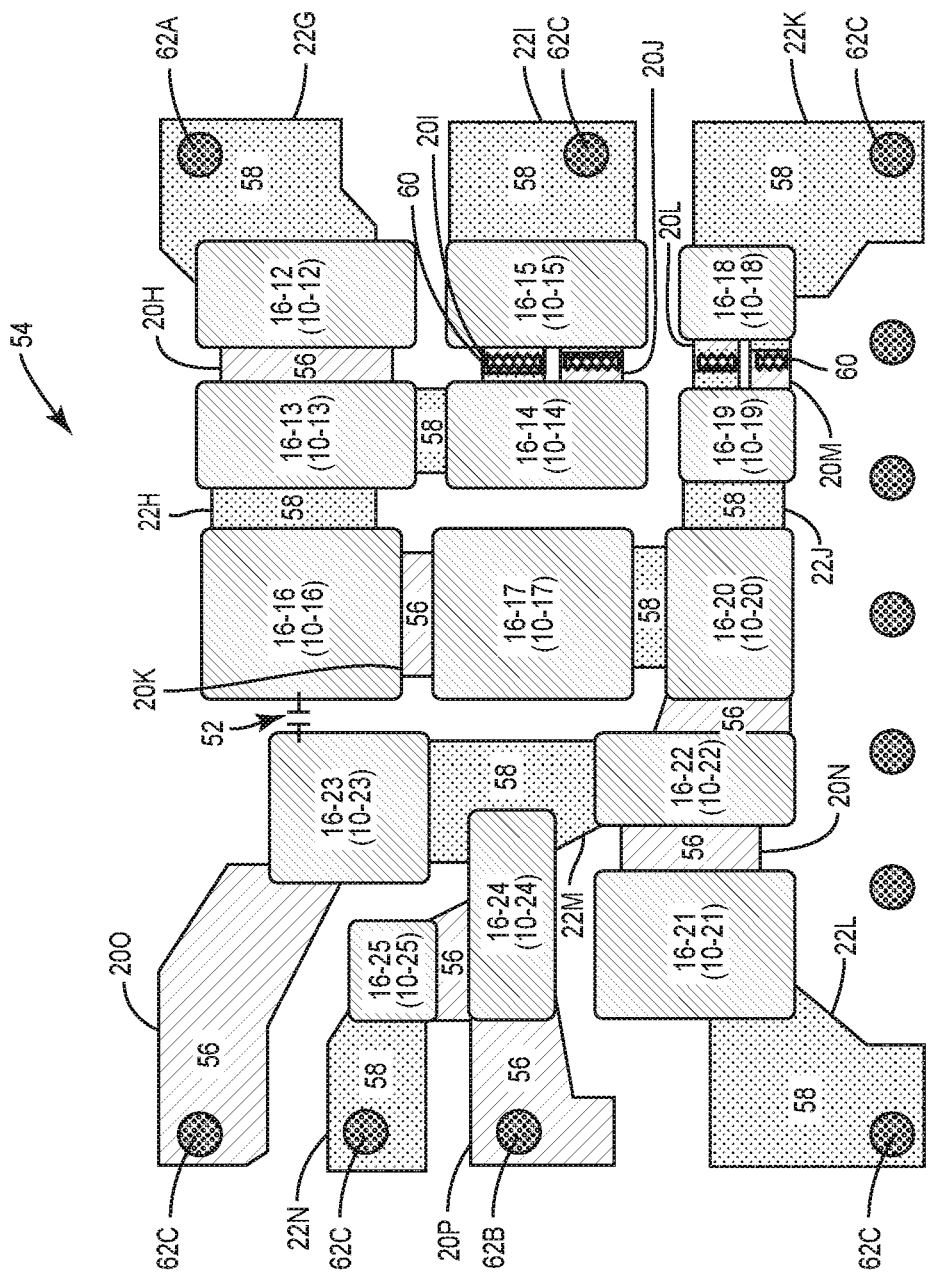
FIG. 10A is a top partial view of a second embodiment of a third filter without electrostatic shielding, the third filter subject to parasitic capacitance, generally similar to (but different from) the parasitic capacitance shown in FIG. 7A.

FIG. 9F is a graph 72 comparing the effect of electrostatic shield 66 on filter rejection of the second filter 44 of FIGS. 9A-9D. In particular, the graph 72 illustrates filter performance between frequencies of 1000 MHz and 3000 MHz. The ideal lumped 74 provides the ideal filter performance for the second filter 44 with no parasitic capacitance 52 (or other unwanted interference). The die em 76 represents an unshielded second filter 44 (as shown in FIG. 10A) illustrating the effect of parasitic capacitance 52 on filter performance. The die em with shield 78 represents a shielded second filter 44 (as shown in FIG. 10D) with second electrostatic shield 66 reducing the effect of parasitic capacitance 52. As shown, the die em with shield 78 of the shielded first filter 44 is much closer to the ideal lumped 74 than the die em 76 of the unshielded first filter 44.

Figure 10B:
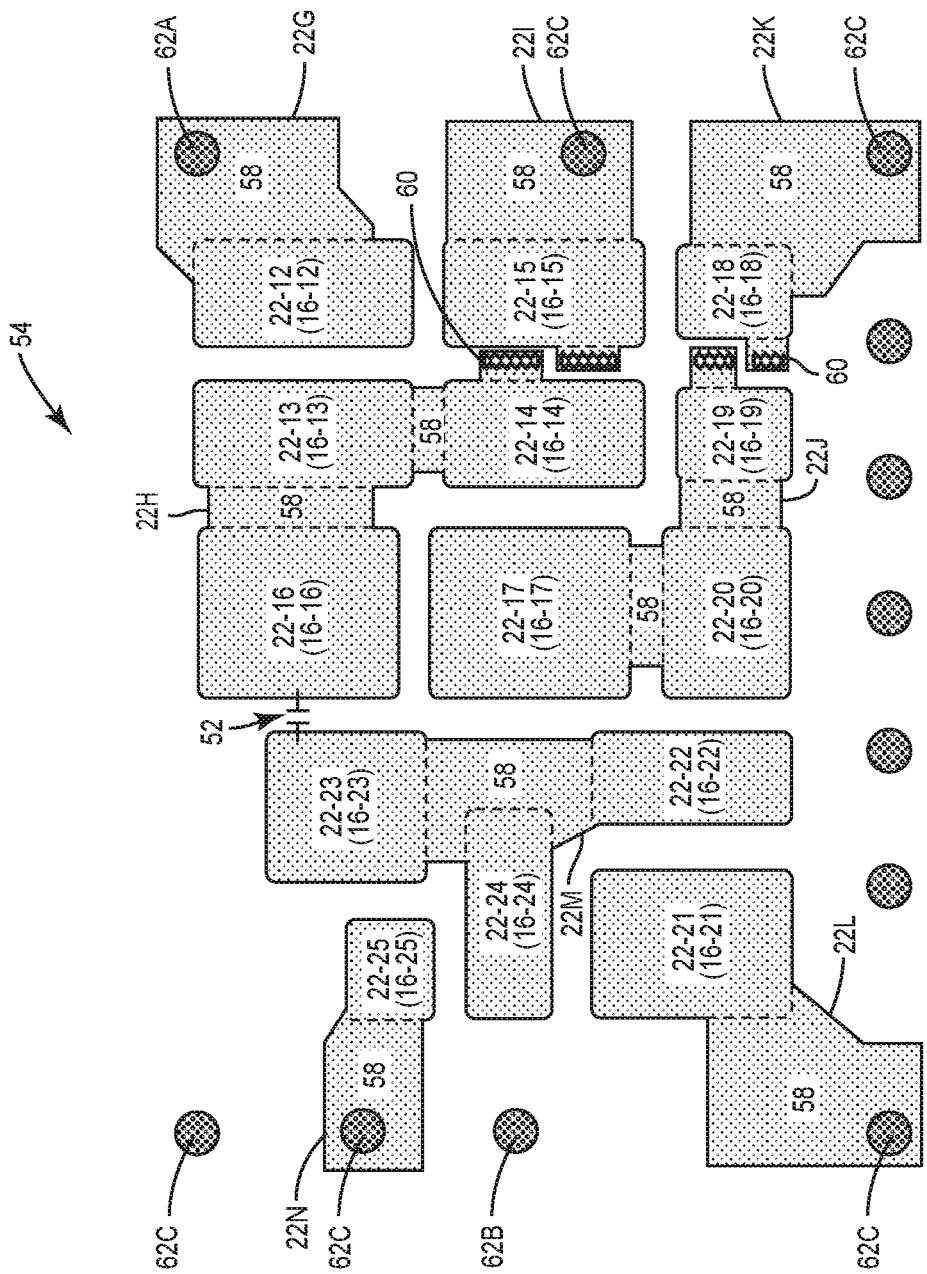
FIG. 10B is a top view of a bottom electrode layer of the third filter of FIG. 10A.
Figure 10C:
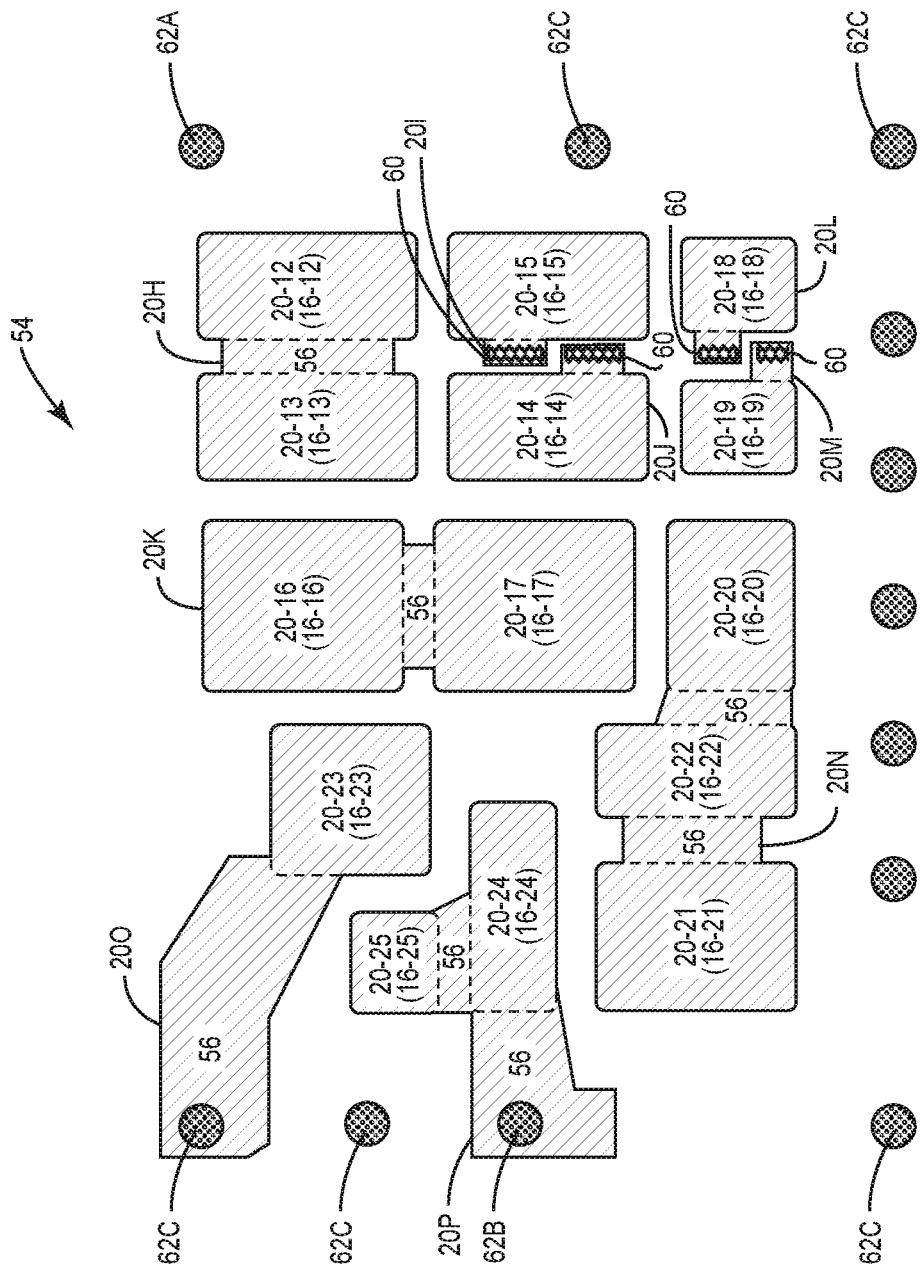
FIG. 10C is a top view of a top electrode layer of the third filter of FIG. 10A.
Figure 10D:
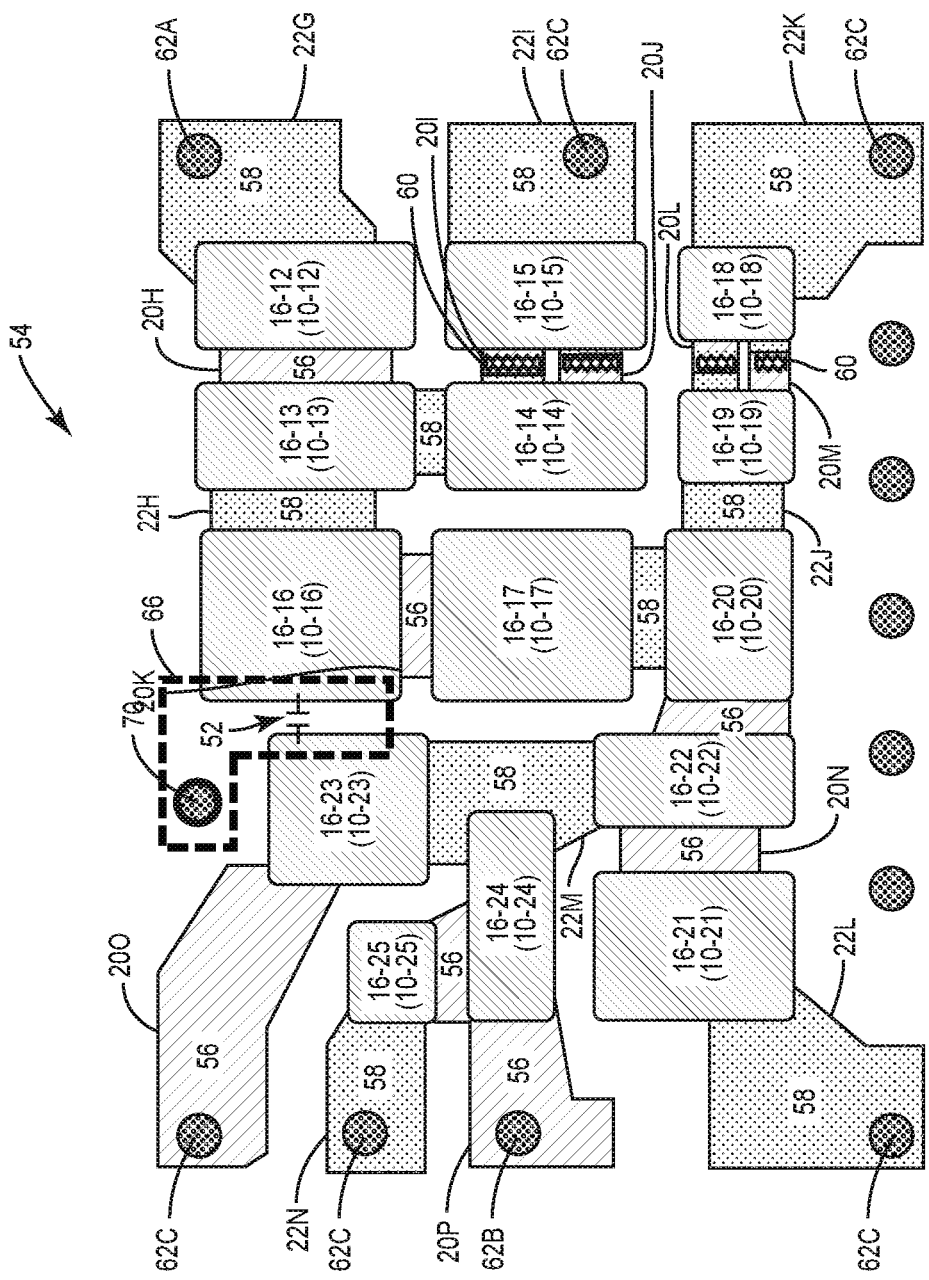
FIG. 10D is a top partial view of the third filter of FIG. 10A with electrostatic shielding reducing the effect of parasitic capacitance as similarly illustrated in FIG. 7C.

FIGS. 10A-10F are views of a third filter 44 without and with electrostatic shield 66. In particular, FIGS. 10A-10C are views of a third partial filter structure 54 of a third filter 44 without electrostatic shield 66. FIG. 10A is a top partial view of the third partial filter structure 54 of the third filter 44 without electrostatic shield 66. The third filter 44 includes a plurality of transducers 16-12 to 16-25 of a plurality of resonators 10-12 to 10-25 which are physically and electrically connected to each other by interconnects 56 of the top electrode 20 and interconnects 58 of the bottom electrode 22. A parasitic capacitance 52 occurs between transducer 16-16 and transducer 16-23. Further, the plurality of transducers 16-12 to 16-25 of the plurality of resonators 10-12 to 10-25 are physically and electrically connected to an input via 62A, an output via 62B, and a plurality of ground vias 62C.

FIG. 10B is a top view of a bottom electrode 22 of the third filter 44 of FIG. 10A. The bottom electrode 22 includes a plurality of portions 22G-22N, where each portion 22G-22N is physically separated from one another. As explained in more detail below, each of these portions 22G-2N forms a different electrical node in the filter 44. Further, each of these portions 22G-22N includes an active portion 22-12 through 22-25 and an interconnect 58. FIG. 10C is a top view of a top electrode layer 20 of the third filter 44 of FIG. 10A. The top electrode 20 includes a plurality of portions 20H-20P, where each portion 20H-20P is physically separated from one another. As explained in more detail below, each of these portions 20H-20P forms a different electrical node in the filter 44.

FIG. 10D is a top partial view of the third filter 44 of FIG. 10A with electrostatic shield 66 reducing the effect of parasitic capacitance 52. The electrostatic shield 66 is configured and positioned to cover a portion of transducer 16-23 (and corresponding resonator 10-23) and a portion of transducer 16-16 (and corresponding resonator 10-16). In other words, the electrostatic shield 66 extends between an adjacent pair of transducers 16-16, 16-23 (and corresponding adjacent pair of resonators 10-16, 10-23). In this way, the electrostatic shield 66 straddles the parasitic capacitance 52 and interrupts the electrical field forming the parasitic capacitance 52 to reduce the parasitic capacitance. The electrostatic shield 66 also forms a shield capacitance between ground and the electrical node including transducer 16-24 (and corresponding resonator 10-24), transducer 16-17 (and corresponding resonator 10-17) and interconnect 58.

Figure 10E:
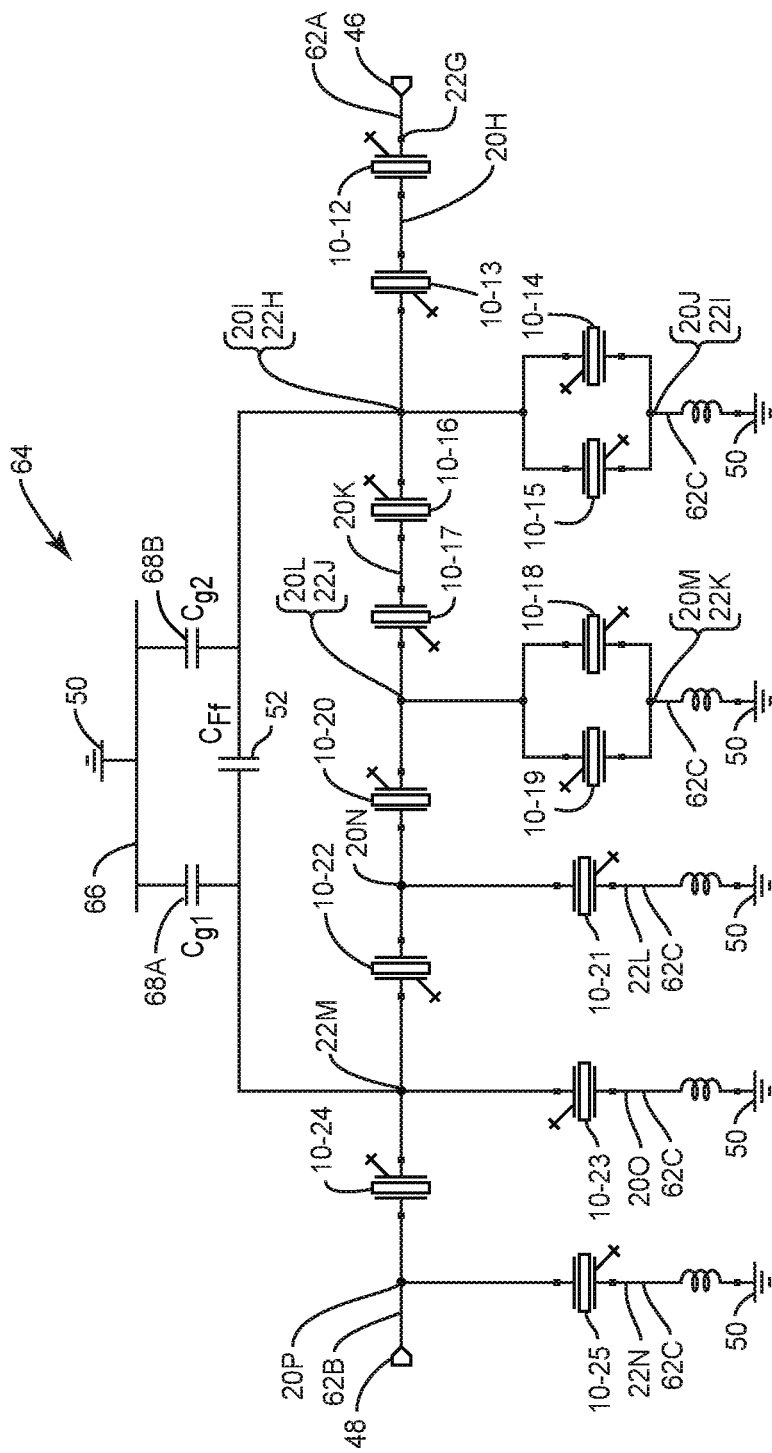
FIG. 10E is a circuit diagram of the third filter of FIG. 10D.

FIG. 10E is a circuit diagram 64 of the third filter of FIG. 10D. The configuration and positioning of the electrostatic shield 66 within or proximate the electrical field forming the parasitic capacitance 52 reduces the strength and influence of the parasitic capacitance 52 on the filter 44. The shield capacitance 68A, 68B formed by the electrostatic shield 66 may be greater or less than the parasitic capacitance 52. It is noted that each portion 22G-22N of the bottom electrode 22 and each portion 20H-20P of the top electrode 20 forms an electrical node within the circuit diagram of FIG. 10E.

Figure 10F:
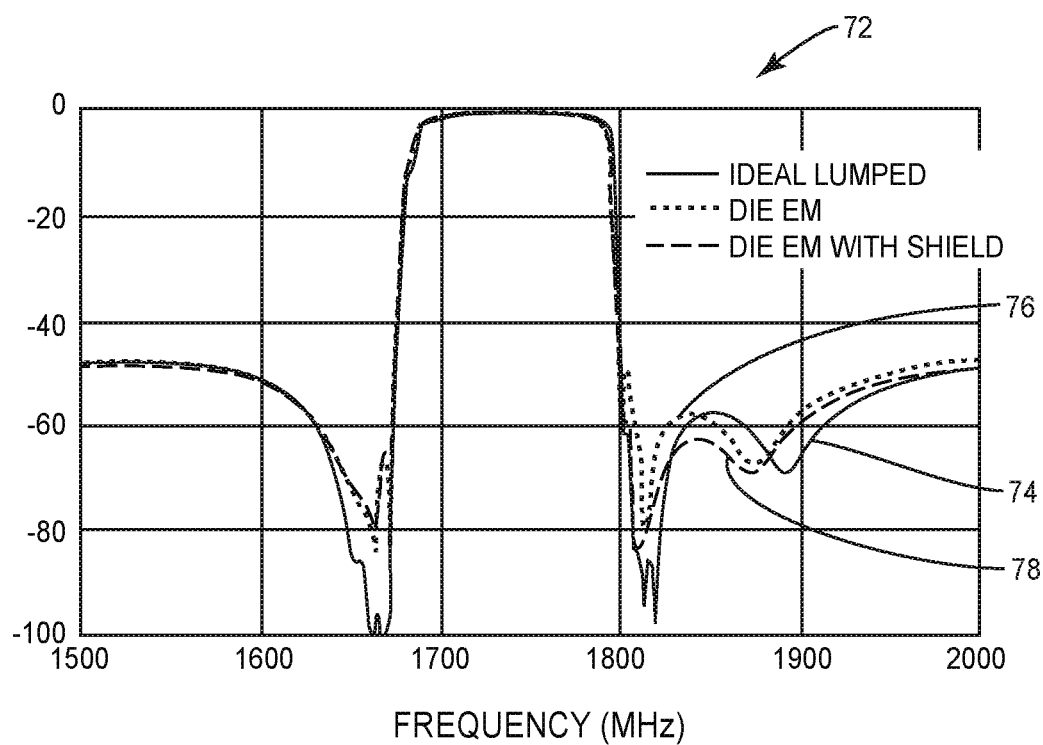
FIG. 10F is a graph comparing the effect of electrostatic shielding on filter rejection of the third filter of FIGS. 10A-10E.

FIG. 10F is a graph 72 comparing the effect of electrostatic shield 66 on filter rejection of the third filter 44 of FIGS. 10A-10D. In particular, the graph 72 illustrates filter performance between frequencies of 1500 MHz and 2000 MHz. The ideal lumped 74 provides the ideal filter performance for the third filter 44 with no parasitic capacitance 52 (or other unwanted interference). The die em 76 represents an unshielded third filter 44 (as shown in FIG. 10A) illustrating the effect of parasitic capacitance 52 on filter performance. The die em with shield 78 represents a shielded third filter 44 (as shown in FIG. 10D) with second electrostatic shield 66 reducing the effect of parasitic capacitance 52. As shown, the die em with shield 78 of the shielded first filter 44 is much closer to the ideal lumped 74 than the die em 76 of the unshielded first filter 44.

Figure 11:
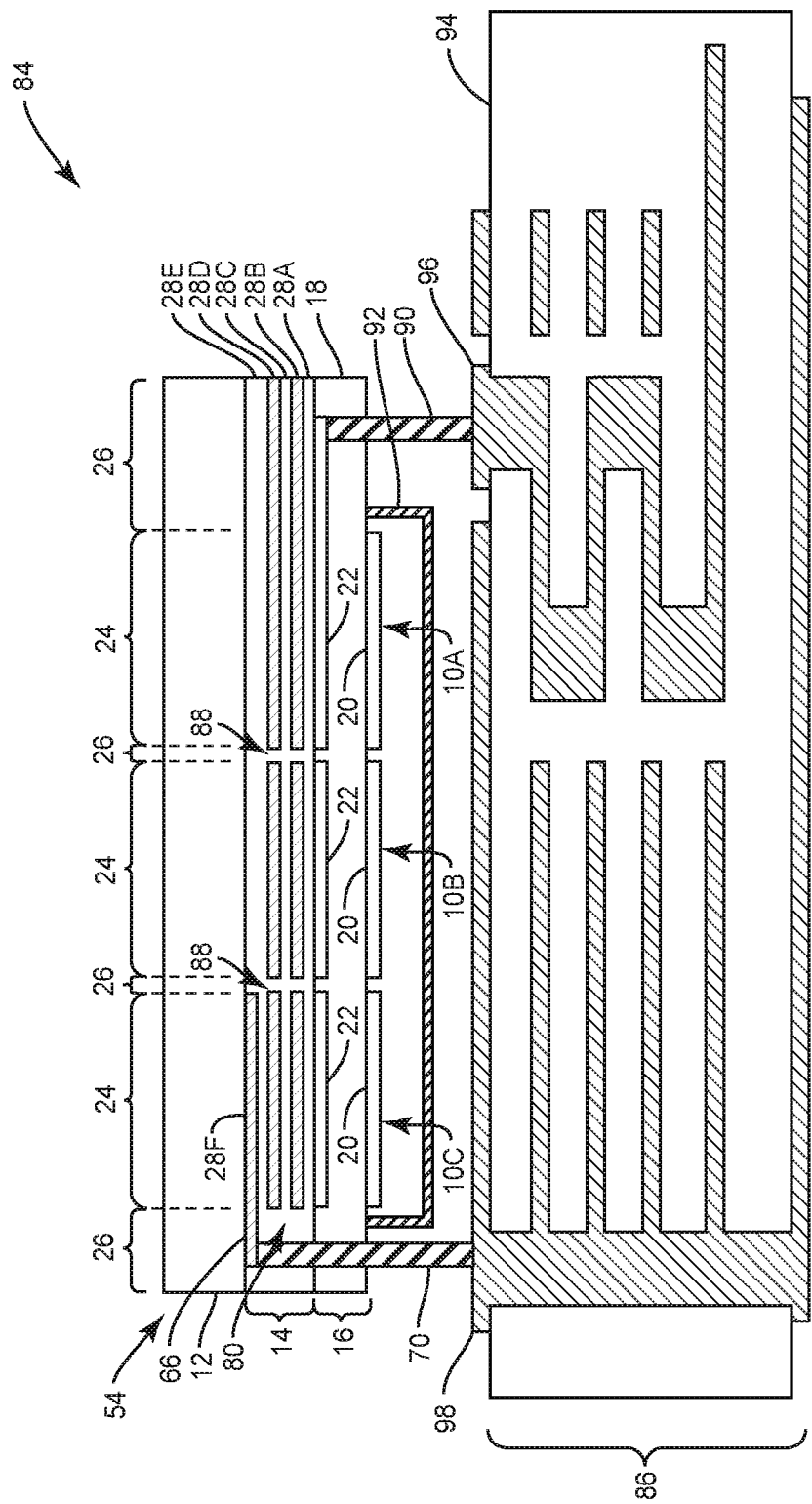
FIG. 11 is a cross-sectional view of a BAW filter assembly including an electrostatic shield similar to those of FIGS. 7D, 8A, 9D, and 10D.

FIG. 11 is a cross-sectional view of a BAW filter assembly 84 including an electrostatic shield similar to those of FIGS. 7D, 8A, 9D, and 10D. In particular, the BAW filter assembly 84 includes an inverted BAW filter structure 54 mounted to a laminate structure 86, such that the bottom electrode 22 is above the top electrode 20. For consistency and clarity with the rest of the application, the BAW filter structure 54 will be described assuming its original orientation (e.g., the top electrode 20 is at a top of the BAW filter structure 54 and the bottom electrode 22 is positioned beneath the top electrode 20). The BAW filter structure 54 includes a plurality of resonators 10A-10C. Of course, more or fewer resonators 10A-10C could be used depending on the performance requirements of the filter 44. Each of the plurality of resonators 10A-10C includes a substrate 12, reflector 14, and transducer 16. Each transducer 16 includes a top electrode 20, bottom electrode 22, and piezoelectric layer 18 therebetween. The piezoelectric layer 18 extends between each of the resonators 10A-10C. In other words, the piezoelectric layer 18 is monolithic, although in other embodiments there may be a gap (e.g., air gap) between the piezoelectric layer 18 of each resonator 10A-10C.

The reflector 14 includes a plurality of layers 28A-28F. The reflector 14 includes conductive layers 28A, 28C, and 28E with alternating layers of conductive materials (e.g., tungsten) and insulative materials (e.g., silicon dioxide). In other words, reflector layers 28A, 28C, and 28E are insulative (e.g., dielectric) and reflector layers 28B, 28D, and 28F are conductive. In this embodiment, reflector layer 28F forms the electrostatic shield 66, where the reflector layer 28F (and corresponding electrostatic shield 66) only extends into the active region 24 of resonator 10C, and does not extend into the active region 24 of resonators 10A-10B. A gap 80 is formed between reflector layer 28F and the shielding via 70. The shielding via 70 extends from the electrostatic shield 66 through the reflector 14, through the piezoelectric layer 18 (and as a result past the bottom electrode 22 and top electrode 20) to form a grounding connection, as explained in more detail below. Further, conductive reflector layers 28B and 28D include gaps 88 between each of the resonators 10A-10C (e.g., thereby isolating the conductive reflector layers 28B and 28D of the active region 24 of the first resonator 10A from the conductive reflector layers 28B and 28D of the active region 24 of the second and third resonators 10B-10C).

It is noted that the reflector layer 28F (and corresponding electrostatic shield 66) could extend into the active regions 24 of one or more resonators 10A-10C. Further, as with reflector layers 28B and 28D, the reflector layer 28F could extend into the active regions 24 of a plurality of resonators 10A-10C but be isolated from each other. In such a circumstance, each of the isolated regions of the reflector layer 28F could form different portions of one electrostatic shield 66 and/or a plurality of electrostatic shield 66. Further, in certain embodiments, different layers form a plurality of different electrostatic shields 66. For example, in certain embodiments, reflector layer 28F forms a first electrostatic shield 66 extending into the active region 24 of the third resonator 10C, and a second electrostatic shield 66 is formed from a different layer (e.g., reflector layer 28B, reflector layer 28C, and/or interconnect of bottom electrode 22, etc.). In such a circumstance, the first electrostatic shield 66 is vertically offset from the second electrostatic shield 66.

The bottom electrode 22 extends from the active region 24 to the outside region 26, where a signal via 90 extends from the bottom electrode through the piezoelectric layer 18 (and as a result past the bottom electrode 22 and top electrode 20) to form a signal connection, as explained in more detail below.

The BAW filter assembly 84 further includes a polymer cavity wall 92 positioned over the top electrodes 22 of the plurality of resonators 10A-10C, between the filter structure 54 and the laminate structure 86. The polymer cavity wall 92 protects acoustics of the resonators 10A-10C to improve performance thereof.

The laminate structure 86 includes a laminate dielectric 94 with a signal trace 96 (also referred to herein as a signal inductor, etc.) and a ground trace 98 (also referred to herein as a ground inductor, etc.) positioned within the laminate structure 86. The laminate structure 86 and/or the filter structure 54 are configured such that, when mounted together, the signal via 90 (also referred to herein as a (also referred to as a signal pin, signal pillar, metal signal pillar, etc.) of the filter structure 54 contacts and forms an electrical connection with the signal trace 96 of the laminate structure 86, and the shielding via 70 contacts and forms an electrical connection with the ground trace 98 of the laminate structure 86.

Those skilled in the art will recognize improvements and modifications to the preferred embodiments of the present disclosure. All such improvements and modifications are considered within the scope of the concepts disclosed herein and the claims that follow.

What is claimed is:

1. A bulk acoustic wave (BAW) filter structure with internal shielding, comprising:
   a substrate;
   a plurality of transducers over the substrate, each of the plurality of transducers comprising a bottom electrode, a piezoelectric layer over the bottom electrode, and a top electrode over the piezoelectric layer, each of the plurality of transducers forming a portion of a BAW resonator and residing in a filter coupled between an input node and an output node and having an electrical field forming a parasitic capacitance; and
   a planar electrostatic shield between the substrate and at least one of the top electrodes of the plurality of transducers, the planar electrostatic shield coupled to a ground node and interrupting the electrical field associated with the parasitic capacitance of the filter to reduce the parasitic capacitance.

2. The BAW filter structure of claim 1, further comprising a via electrically coupled to the planar electrostatic shield, wherein the planar electrostatic shield is grounded through the via.

3. The BAW filter structure of claim 2, further comprising a reflector structure positioned over the substrate, wherein the via extends through at least a portion of the reflector structure.

4. The BAW filter structure of claim 2, wherein the via extends through at least a portion of the piezoelectric layer.

5. The BAW filter structure of claim 1, further comprising a reflector structure positioned over the substrate, wherein the reflector structure comprises a plurality of reflector structures, and the BAW resonator comprises a plurality of BAW resonators, each of the plurality of BAW resonators comprising at least one of the plurality of reflector structures.

6. The BAW filter structure of claim 1, further comprising a reflector structure positioned over the substrate, wherein the reflector structure comprises a plurality of insulative reflectors and at least one conductive reflector.

7. The BAW filter structure of claim 6, wherein the at least one conductive reflector comprises the planar electrostatic shield.

8. The BAW filter structure of claim 6, wherein the at least one conductive reflector comprises a plurality of conductive reflectors, at least one of the plurality of conductive reflectors comprising the planar electrostatic shield.

9. The BAW filter structure of claim 1, further comprising a reflector structure positioned over the substrate, wherein the planar electrostatic shield is parallel to a top surface of the substrate and at least one of:
   over a top surface of the reflector structure,
   over a bottom surface of the reflector structure, or
   within the reflector structure.

10. The BAW filter structure of claim 1, wherein the bottom electrode comprises a plurality of bottom electrode portions physically separated from one another, and at least one of the plurality of bottom electrode portions comprises the planar electrostatic shield.

11. The BAW filter structure of claim 1, wherein the planar electrostatic shield comprises a plurality of planar electrostatic shields.

12. The BAW filter structure of claim 11, wherein a first planar electrostatic shield is vertically offset from a second planar electrostatic shield.

13. The BAW filter structure of claim 1, wherein the planar electrostatic shield is only electrically connected to the filter by a shield capacitance.

14. The BAW filter structure of claim 1, wherein at least a portion of the planar electrostatic shield is positioned beneath at least a portion of one of the plurality of transducers.

15. The BAW filter structure of claim 1, wherein the planar electrostatic shield is not positioned beneath one of the plurality of transducers.

16. The BAW filter structure of claim 1, wherein the planar electrostatic shield extends between an adjacent pair of the plurality of transducers.

17. A bulk acoustic wave (BAW) filter assembly, comprising:
   a laminate comprising a laminate dielectric, a grounding trace at least partially positioned within the laminate dielectric, and a signal trace at least partially positioned within the laminate dielectric; and
   a BAW filter structure, comprising:
      a substrate;
      a plurality of transducers over the substrate, each of the plurality of transducers comprising a bottom electrode, a piezoelectric layer over the bottom electrode, and a top electrode over the piezoelectric layer, each of the plurality of transducers forming a portion of a BAW resonator and residing in a filter coupled between an input node and an output node and having an electrical field forming a parasitic capacitance; and
      a planar electrostatic shield between the substrate and at least one of the top electrodes of the plurality of transducers, the planar electrostatic shield coupled to a ground node and interrupting the electric field associated with the parasitic capacitance of the filter to reduce the parasitic capacitance;
   wherein the BAW filter structure is invertedly positioned over a top of the laminate.

18. The BAW filter assembly of claim 17, wherein the BAW filter structure further comprises a shielding pillar electrically coupled to the grounding trace and the planar electrostatic shield.

19. The BAW filter assembly of claim 18, wherein the BAW filter structure further comprises a signal pillar electrically coupled to the signal trace and the bottom electrode of at least one of the plurality of transducers.

20. The BAW filter assembly of claim 17, wherein the BAW filter structure comprises a plurality of BAW filter structures.

\* \* \* \* \*

UNITED STATES PATENT AND TRADEMARK OFFICE
CERTIFICATE OF CORRECTION

PATENT NO. : 10,361,676 B2  
APPLICATION NO. : 15/720706  
DATED : July 23, 2019  
INVENTOR(S) : Yazid Yusuf Page 1 of 1

It is certified that error appears in the above-identified patent and that said Letters Patent is hereby corrected as shown below:

In the Specification

In Column 7, Line 61, replace "$(f_{S,SH})$" with --$(f_{P,SH})$--.

In Column 7, Line 62, replace "$(f_{S,SER})$" with --$(f_{P,SER})$--.

In Column 8, Line 5, replace "$(f_{S,SH})$" with --$(f_{P,SH})$--.

Signed and Sealed this  
Twenty-seventh Day of August, 2019

Andrei Iancu  
*Director of the United States Patent and Trademark Office*